United States Patent
Rozario et al.

(10) Patent No.: US 7,088,173 B1
(45) Date of Patent: Aug. 8, 2006

(54) ADJUSTABLE MULTIPORT POWER/PHASE METHOD AND SYSTEM WITH MINIMUM PHASE ERROR

(75) Inventors: Novellone Rozario, Yardville, NJ (US); Herbert Joseph Wolkstein, Livingston, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 62 days.

(21) Appl. No.: 10/840,942

(22) Filed: May 7, 2004

(51) Int. Cl.
*G01R 19/00* (2006.01)
*H03F 3/68* (2006.01)

(52) U.S. Cl. .................................. 330/2; 330/124 R
(58) Field of Classification Search .............. 330/2, 330/53, 84, 124 R, 124 D, 286, 295
See application file for complete search history.

(56) References Cited

U.S. PATENT DOCUMENTS

| | | | | |
|---|---|---|---|---|
| 5,917,371 A | * | 6/1999 | Chesarek et al. | 330/124 R |
| 6,006,111 A | * | 12/1999 | Rowland | 455/561 |
| 6,437,642 B1 | | 8/2002 | Rozario | |
| 6,750,707 B1 | * | 6/2004 | Takei et al. | 330/124 R |

* cited by examiner

*Primary Examiner*—Khanh Van Nguyen
(74) *Attorney, Agent, or Firm*—McDermott Will & Emery LLP

(57) ABSTRACT

A method for tuning phase relationships for a multi-port amplifier. The method includes providing a plurality of amplifiers arranged in a multi-port configuration, which has more than two amplifiers. The method includes selecting one of a plurality of test patterns to be input into one or more of the plurality of amplifiers to detect phase information of one or more of the amplifiers and detecting an output signal at a designated output coupled to the plurality of amplifiers. The method also includes adjusting a phase relation of the one or more amplifiers based upon the output signal.

33 Claims, 15 Drawing Sheets

THE SCHEME FOR TUNING WITHOUT INTERRUPTION OF TRAFFIC

OUTPUT HYBRID (OH)

INPUT HYBRID (IH)

AMPLIFIER

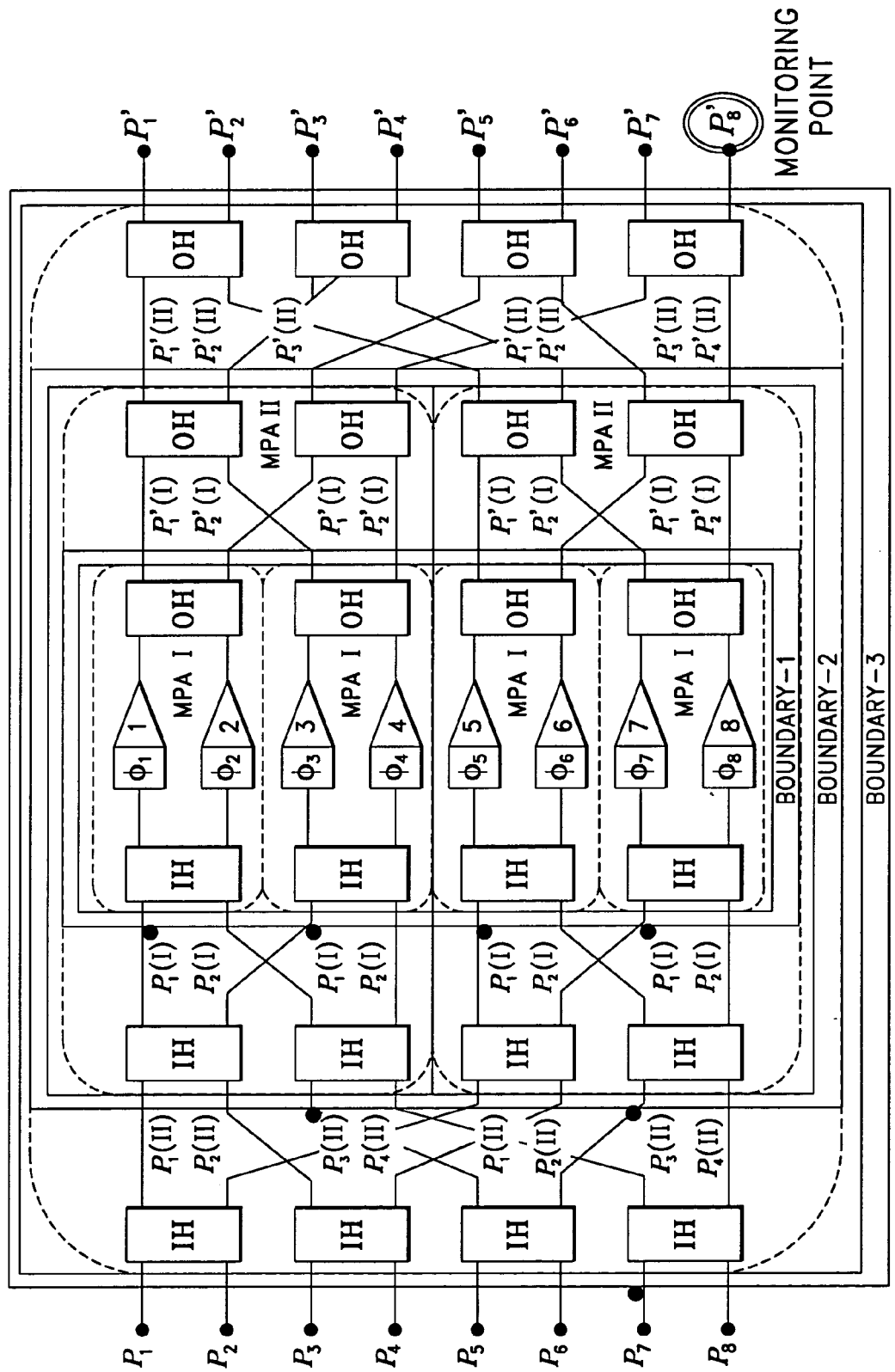
FIG. 5 MPA STRUCTURE, INVENTION

THE SCHEME FOR TUNING WITHOUT INTERRUPTION OF TRAFFIC

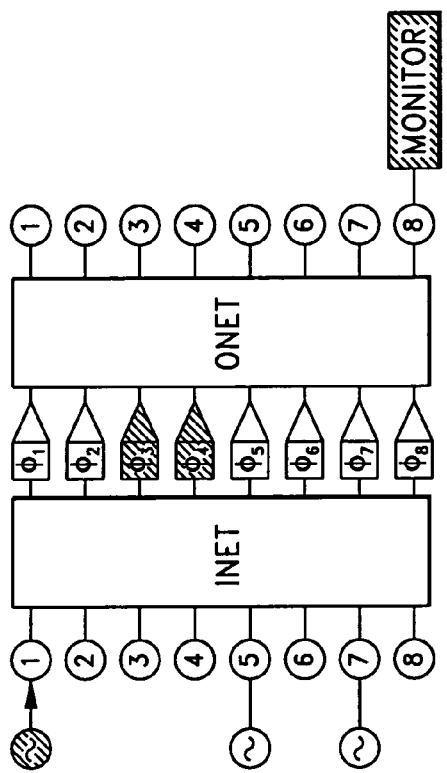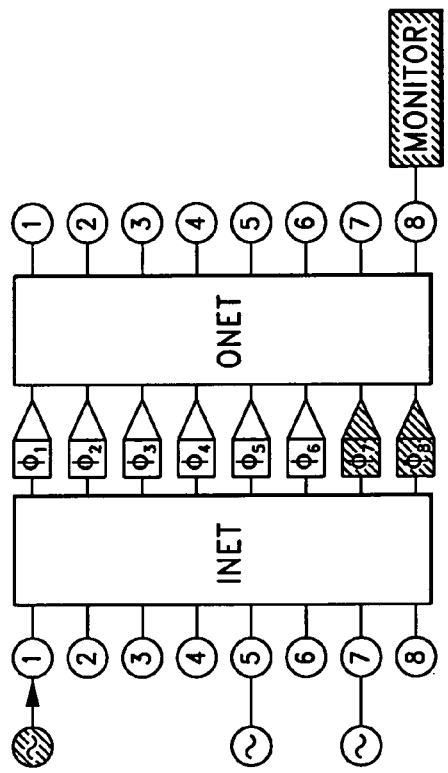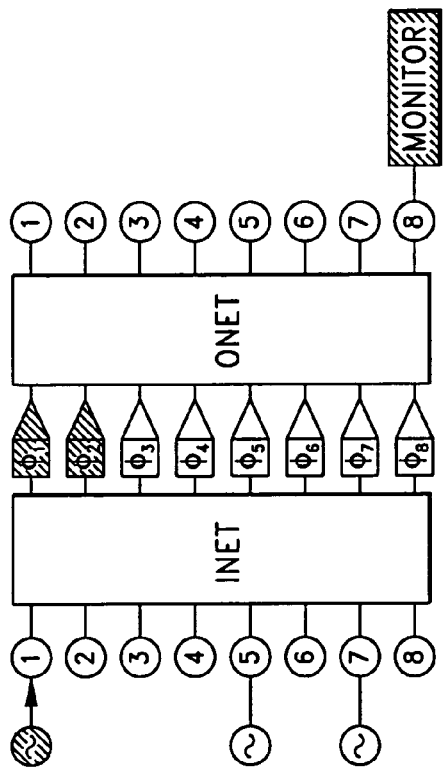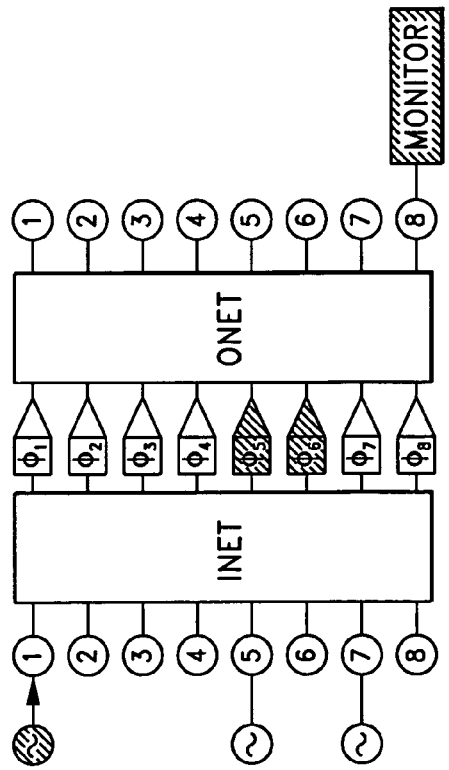
FIG. 7a STEP-1. RESULT $\phi_1=\phi_2$
FIG. 7b STEP-2. RESULT $\phi_3=\phi_4$
FIG. 7c STEP-3. RESULT $\phi_5=\phi_6$
FIG. 7d STEP-4. RESULT $\phi_7=\phi_8$

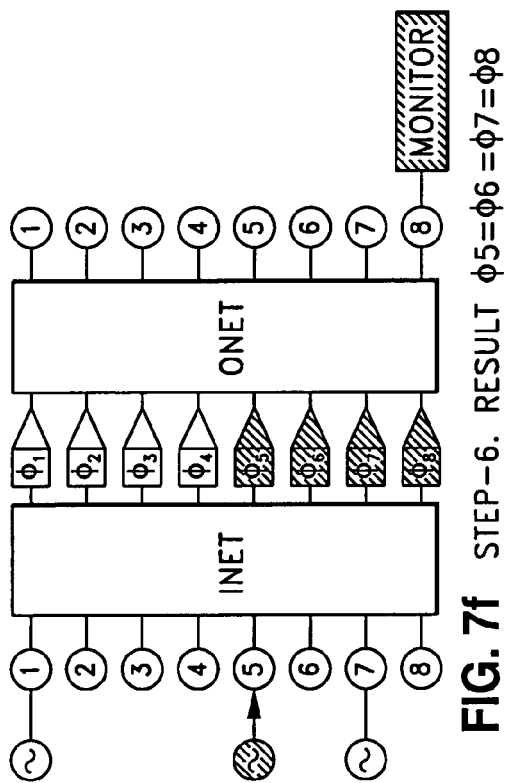
FIG. 7f STEP-6. RESULT $\phi_5=\phi_6=\phi_7=\phi_8$
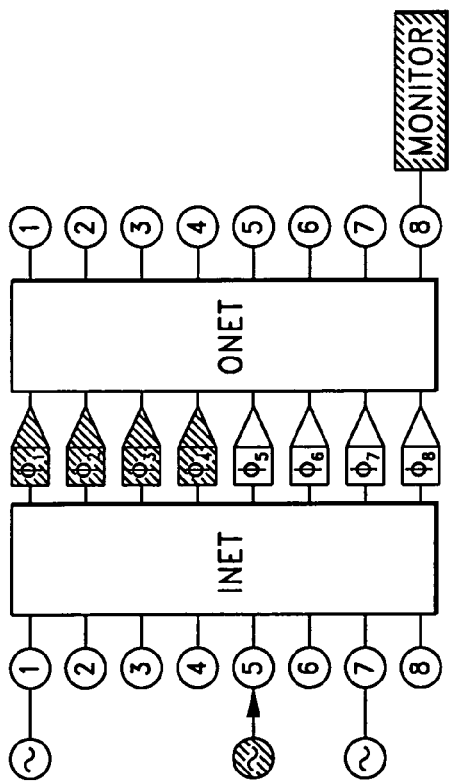
FIG. 7e STEP-5. RESULT $\phi_1=\phi_2=\phi_3=\phi_4$
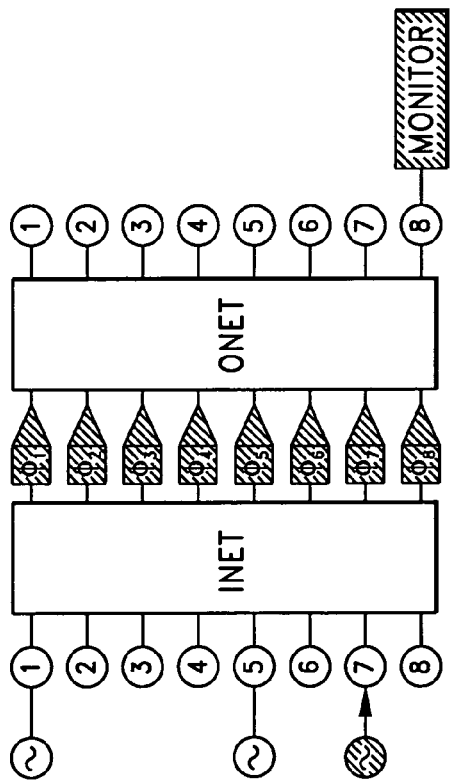
FIG. 7g STEP-7. RESULT $\phi_1=\phi_2=\phi_3=\phi_4=\phi_5=\phi_6=\phi_7=\phi_8$

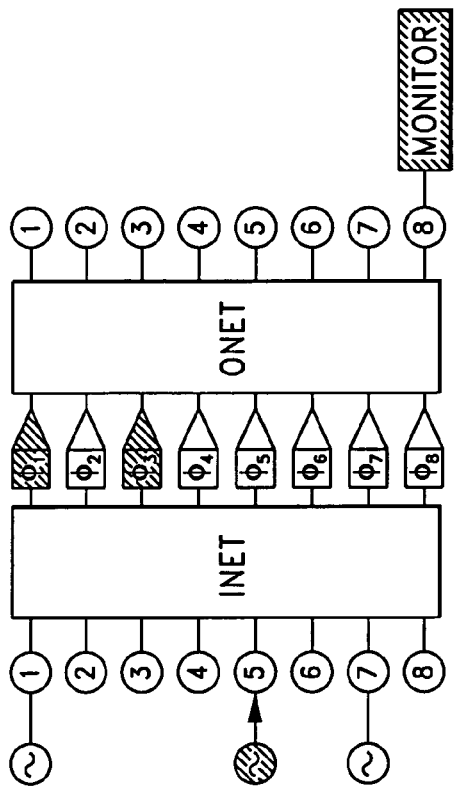
FIG. 8a STEP-1. RESULT φ1=φ5
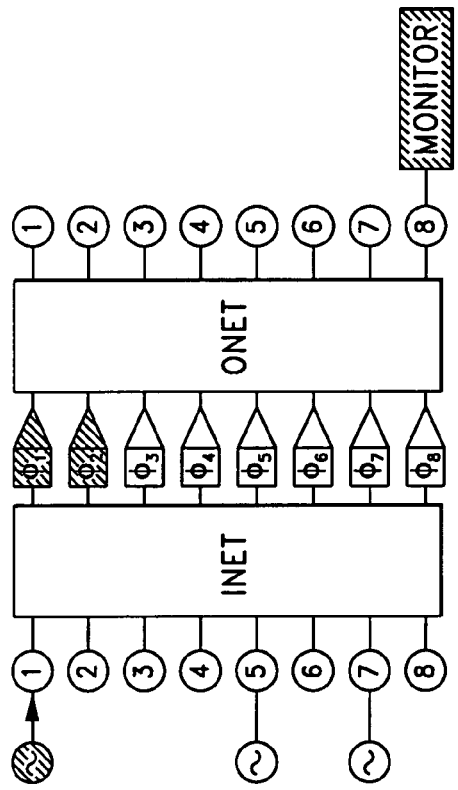
FIG. 8b STEP-2. RESULT φ1=φ3
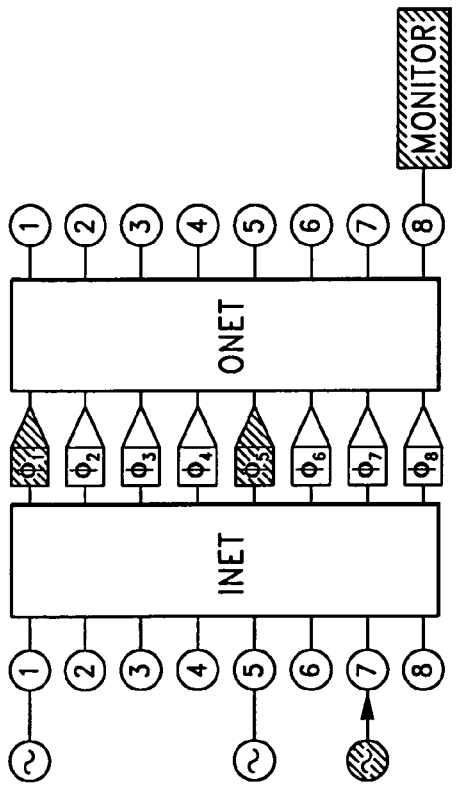
FIG. 8c STEP-3. RESULT φ5=φ7
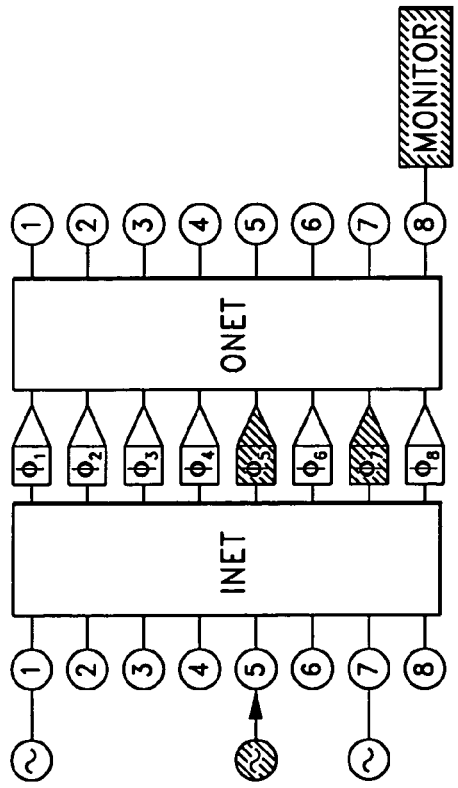
FIG. 8d STEP-4. RESULT φ1=φ2

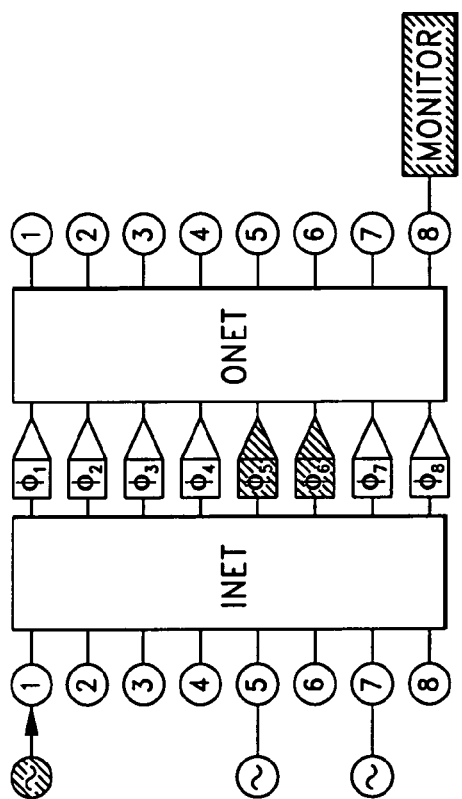
FIG. 8f STEP-6. RESULT $\phi5=\phi6$
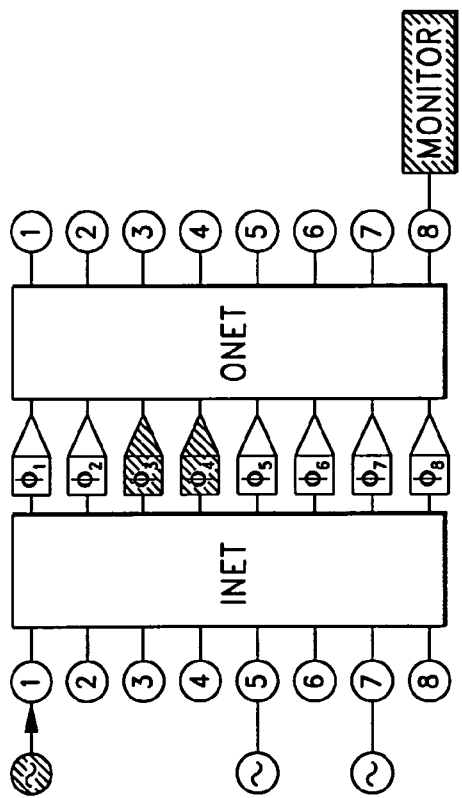
FIG. 8e STEP-5. RESULT $\phi3=\phi4$
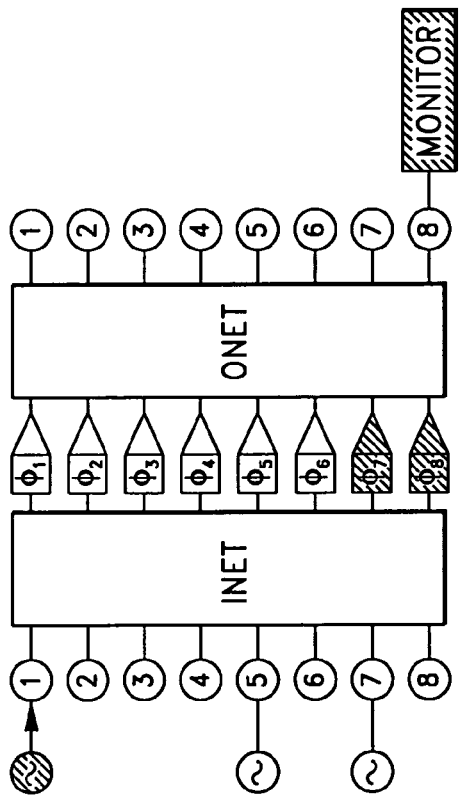
FIG. 8g STEP-7. RESULT $\phi7=\phi8$

DUAL-SHIFTING TEST AND MONITOR POINTS

FIG. 10  10x10 MPA TUNING

FIG. 11 USING EXTERNAL HYBRIDS

EQUALIZING THE PHASE OF A GROUP OF MPAs

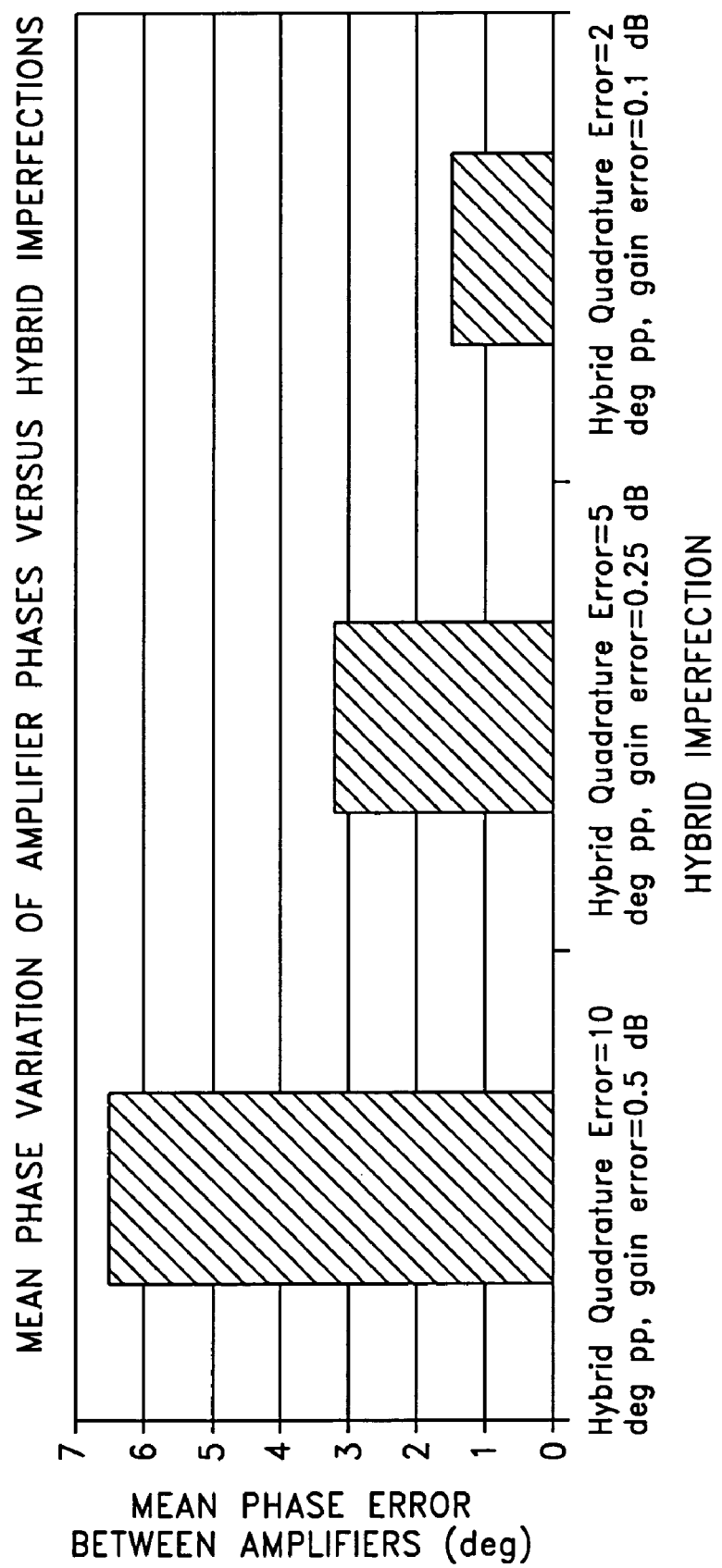
FIG. 13 PERFORMANCE

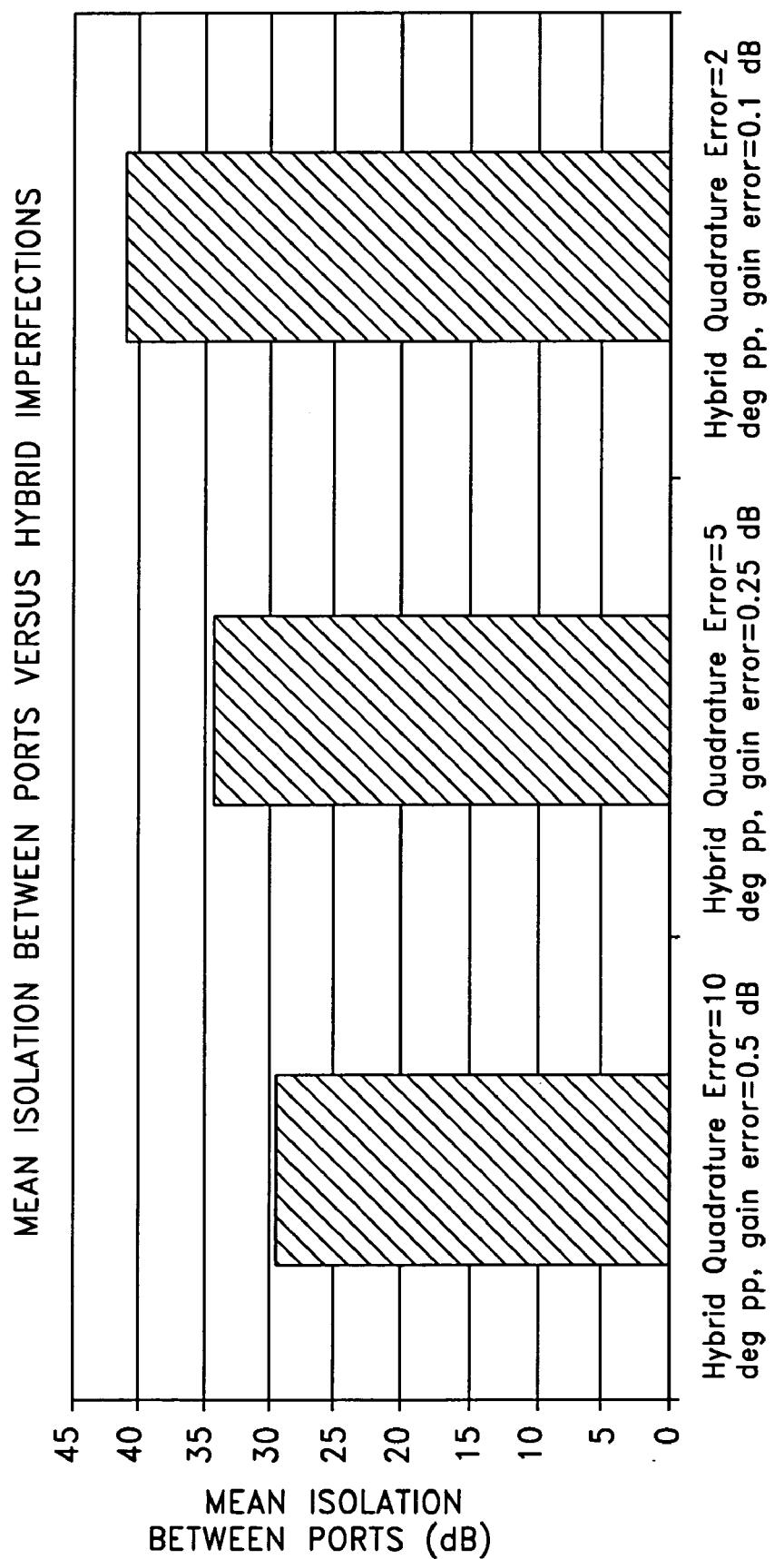
FIG. 14 PERFORMANCE

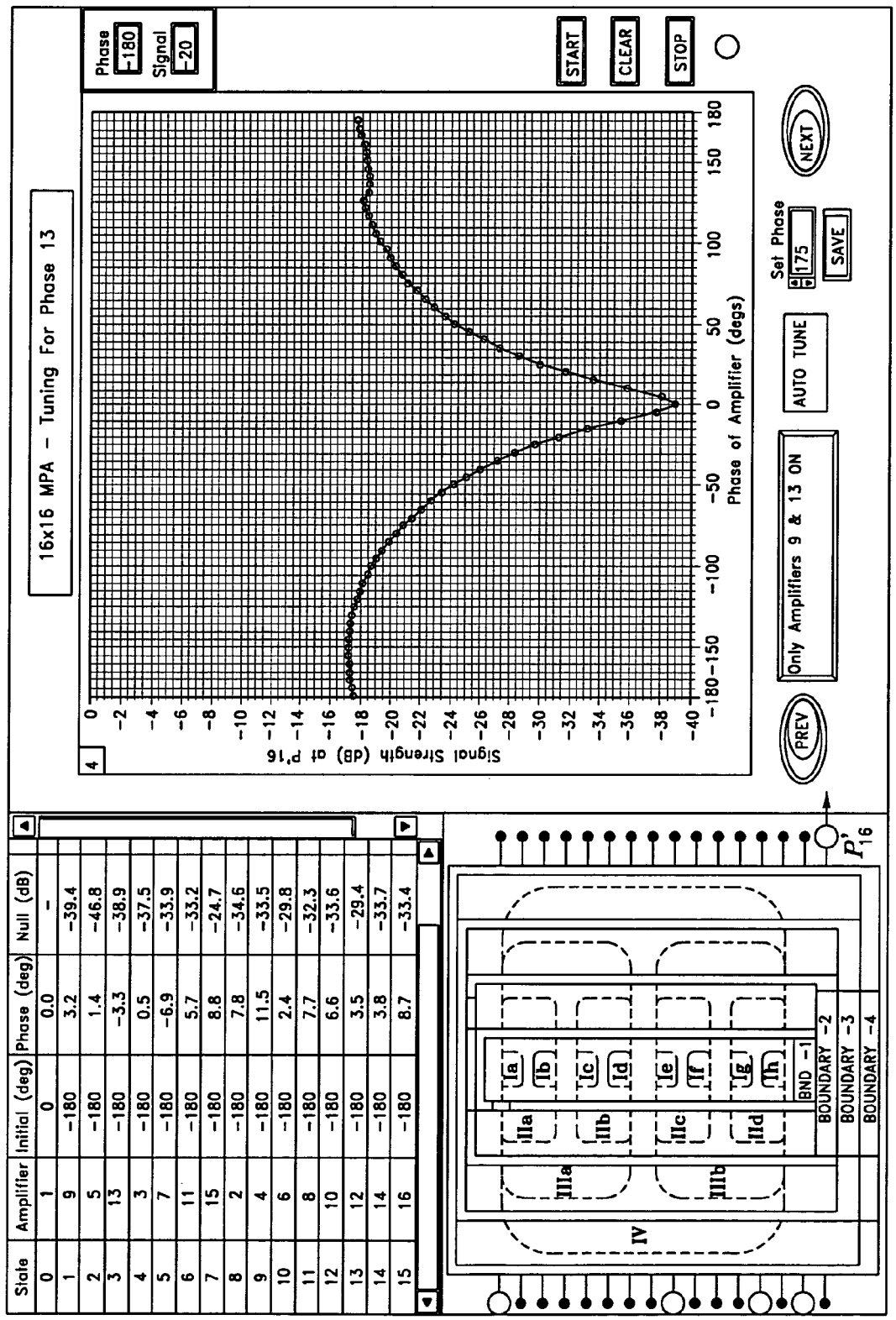
FIG. 15 EXPERIMENTAL VALIDATION

ADJUSTABLE MULTIPORT POWER/PHASE METHOD AND SYSTEM WITH MINIMUM PHASE ERROR

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to transmitting amplified telecommunication signals from satellites. More particularly, the invention provides a method and system for controlling a phase of an amplifier, which is provided in a multi-port configuration. More particularly, the present invention provides a method and system for tracking and controlling a phase of amplifiers in a common pool, such as a Multi-Port Amplifier system (MPA) using a substantially non-intrusive phase detection technique. But it would be recognized that the invention has a much broader range of applicability.

Telecommunication techniques have progressed through the years. From the early days, telecommunication signals traversed through hard wires and still do in many parts of the world. An example of a hard wire is the commonly known twisted pair, which is used throughout most homes in the United States of America. Optical cables are also used to transmit telecommunication signals. The optical cables transmit telecommunication signals at high speeds in a multiplexed manner. Other techniques use wireless transmission of telecommunication signals. Satellites have been used to transfer such signals at high speeds all over the world. Satellites include high powered amplifiers to increase an intensity of these signals for transmission from the satellite once the signals have been received from an antenna.

High powered amplifiers employed to generate beams of a multiple beam active transmitting phased array antenna often operate at the same power level. The power level required to generate one beam, however, is often different from the power level required to generate another beam. As a result, there is an inefficient use of power since some beams will have more power available than is needed to generate the beam than others. In an effort to solve the problem of inefficient power use, a common pool amplifier system, such as MPA, was developed.

A common pool amplifier system generates each beam by obtaining the power level necessary for each beam from a pool of amplifiers. The common pool amplifier system typically requires that each of the amplifiers in the system operate at the same phase. An amplifier having an incorrect phase affects the correct steering of beams, and thus, the overall utility of a multiple beam active transmitting phased array antenna employing the common pool amplifier system. Several techniques have been implemented to enable the operation of each amplifier at the same phase in a common pool amplifier system.

One technique involves manufacturing each amplifier that is to be employed in a common pool amplifier system with identical specifications. These common pool amplifiers are often called high precision amplifiers. Unfortunately, this technique suffers from many drawbacks. For example, manufacturing identical amplifiers has been costly and difficult to achieve. Additionally, once the amplifiers have been manufactured, a time consuming test process has often been required. Moreover, amplifiers originally manufactured to have identical phases, and tested to the same specification, deteriorate over time. This deterioration results in one or more amplifiers having phase error, which is often difficult to correct once the amplifiers have been placed in a satellite system.

Several techniques have been implemented in an effort to track and correct phase error of amplifiers that have developed due to deterioration of the amplifier over time. Trial and error is one such technique implemented. In the trial and error technique, the phase of each individual amplifier in the common pool is tracked. Upon identifying an amplifier that has developed phase error, the phase of the amplifier is manually corrected to correspond to the phase of the other amplifiers in the common pool of amplifiers. This method of tracking and correcting the phase of amplifiers is costly and time consuming since each individual amplifier must be physically tested and corrected.

Accordingly, there is a need for a method and system to improve communication techniques including amplifiers.

SUMMARY OF THE INVENTION

According to the present invention, techniques for transmitting amplified telecommunication signals from satellites are provided. More particularly, the invention provides a method and system for controlling a phase of an amplifier, which is provided in a multi-port configuration. More particularly, the present invention provides a method and system for tracking and controlling a phase of amplifiers in a common pool, such as a Multi-Port Amplifier system (MPA) using a substantially non-intrusive phase detection technique. But it would be recognized that the invention has a much broader range of applicability.

This invention applies to multi-port amplifier systems that are commonly used in multiple beam antennas, regardless of whether these beams are fixed or steerable, transmitting or receiving. Multiple beam antennas can transmit or receive a plurality of beams. When the antenna is transmitting, the RF power for the beams is generated by amplifying the signal with high power amplifiers (HPA). The high RF power then passes through the antenna that radiates the signal in the direction of the beams. The antenna beams can either be steerable or fixed. Steerable beams are produced by phased-array antennas and the beam directions are formed by a beamforming network that applies appropriate phases and gains to signals that feed the antenna elements. On the other hand, when fixed beams are needed, they are usually produced by conventional non phased-array antennas whose beam directions are formed by geometrically focusing the antenna elements in the desired directions. When the antenna is receiving rather than transmitting, the weak RF signal that is picked up by the beams is strengthened by amplifying the signal with low noise amplifiers (LNA) and, just as in the transmit case, the beams can be formed either by steerable or fixed means. Steering or focusing the directions of the beams enables users in different locations to benefit from the signal delivered or received by the beams.

In applications where the antenna is transmitting, typically, each HPA operates at the same operating point in order to maximize the DC to RF power conversion efficiency. Often, however, the power level required to generate one beam is different from the power level required to generate another beam. For example, users in certain directions may require more power because they may be experiencing greater atmospheric fade, or are using poorer quality equipment, or may simply be requiring a higher signal quality. As a result, there is an inefficient use of power since some beams will need more power, and other beams will have more power available than needed. This problem is present in both phased array and non phased array antenna systems. The common pool amplifier system solves these problems.

A common pool amplifier system (FIG. 1) generates the power level required for each antenna element from a pool of N identical amplifiers. Often times, the two most desirable properties of such a system are that ideally, (1) it should distribute all incoming signals uniformly to the amplifiers so that all, if not almost all, amplifiers take part in amplifying the signals, and (2) it should be transparent; that is, a signal applied to input port n comes out only at the corresponding output port n', with none of it leaking to any other port.

Due to the linearity property, when signals 1, 2, . . . are simultaneously applied to input ports, $n_1$, $n_2$, . . . , then they come out, equally amplified, only at the corresponding output ports $n'_1$, $n'_2$, . . . , without leakage to unintended ports. All amplifiers in the pool operate at approximately the same operating point to maximize efficiency, and beams that need more power take more power from the pool and those that need less take less. As is seen in FIG. 1, the set of amplifiers is configured in a paralleled amplifier arrangement and is sandwiched at the input by an input network (INET) and at the output by an output network (ONET). Each amplifier essentially adds a gain G and a phase θ to the signal (FIGS. 2a and 2b), and these values are in general different for the different amplifiers, which is why there is a problem that needs to be solved. The INET is an input distribution network, having a sequence of input hybrid power dividers, denoted by IH, which distributes the RF signal to the set of amplifiers. In a typical application that involves 2, 4, 8, 16, . . . (i.e. N is a power of 2) paralleled amplifiers, the RF signal is equally distributed to all amplifiers. In other applications that involve 6, 10, 12, 14, . . . . (i.e. N is a multiple of 2, but not a power of 2) paralleled amplifiers, the RF signal is distributed equally to a subset of the N amplifiers, where the number of elements of the subset is the largest power of 2 that is less than or equal to N. The signals amplified by the amplifiers are collected by the ONET that acts as a combining network. The ONET is made up of output hybrid power combiners, denoted by OH. The common pool amplifier system is frequently referred to as the Multi-port Amplifier (MPA), although other names such as paralleled amplifier arrangement, Hybrid Amplifier and Matrix Hybrid Amplifier are also used. The MPA has N input ports and N output ports, and FIG. 1 shows the case where N=8. In a common MPA, a signal applied to port n of the input should result in an amplified version of it at the corresponding port n' of the output and no part of it should leak to any other output port.

The INET is comprised of several hybrids interconnected with each other. They also form a N×N network; that is, this network has N inputs and N outputs. The number of hybrids in the INET equals $(N/2)Int(\log_2 N)$, where Int(x) means the greatest integer less than or equal to x, and $\log_2(x)$ is the logarithm to the base 2 of x. For example, according to this formula, the number of hybrids is 1, 4, 6, 12, 15, 18, 21, and 32 when the number N of amplifiers is 2, 4, 6, 8, 10, 12, 14 and 16 respectively. The ONET is a network comprised of several hybrids and is functionally the mirror image of the INET.

The hybrid is an RF term used for a 2×2 network, with two input ports, and two output ports. The hybrid can serve either as a power divider or power combiner. FIG. 3 shows the input hybrid (IH) which is used as a power divider. In FIG. 3a, a signal of 1 Watt and 0 phase is applied to port 1, and it is seen to be divided equally to the output ports 1 and 2, so that output port 1 gets ½ Watt at 0° phase and output port 2 gets ½ Watt at 90° phase. Such a relationship between the output phases is known as a quadrature relationship, and these hybrids are therefore also known as quadrature hybrids. If a signal of 1 Watt is applied to input port 2 (FIG. 3b), it is also divided equally to output ports 1 and 2; however, output port 1 gets ½ Watt at 90° phase and output port 2 gets ½ Watt at 0° phase; that is, the phases are switched. FIG. 4 shows the output hybrid (OH) which is used as a power combiner. Comparing FIGS. 3a and 3b to 4a and 4b, it is seen that the IH is the same as the OH except that the signal ports are switched at the output. In the current literature on MPAs, this distinction between IH and OH is usually not observed, and it results in the output port numbers of the MPA being ordered in the reverse sequence of the input port numbers. By maintaining this distinction between IH and OH, the input and output ports of the MPA are ordered in the same sequence.

Both the INET and the ONET are mathematically represented by N×N matrices U and V respectively and it can be shown that the product of these two matrices is the unit matrix; that is, UV=I. The set of paralleled amplifiers can be mathematically represented by a diagonal matrix, A. Hence the MPA can be mathematically represented by the matrix product UAV. Since in an ideal MPA, a signal applied to port n of the input should result in an amplified version of it only at the corresponding port n', it is mathematically necessary that all the diagonal entries of A be identical. This means that each of the amplifiers in the system should operate at the same phase and gain. An amplifier having an incorrect phase or gain will result in the unintentional leakage of power to other beams, and thus, severely compromises the overall utility of the common pool amplifier system. Usually, the inequalities in gain are very slight, such that they can be ignored; but phase shifts can sneak in unpredictably and severely degrade signal quality and hence cannot be ignored. Several techniques have been implemented to enable the operation of each amplifier at the same phase in a common pool amplifier system.

One technique involves manufacturing each amplifier that is to be employed in a common pool amplifier system with identical specifications. Unfortunately, this technique suffers from the drawbacks of: 1) being costly to implement due to the requirements of manufacturing identical amplifiers; and 2) being time consuming to execute due to the testing needed to ensure that the amplifiers are indeed identical; and 3) being difficult, and sometimes impossible, to autonomously switch in spare amplifiers in the event of failures. Moreover, amplifiers originally manufactured to have the same phase, and tested to the same specification, deteriorate over time. This deterioration results in one or more amplifiers having phase or gain error.

Several techniques have been implemented in an effort to track and correct the phase errors of amplifiers. Trial and error is one such technique and "tightening up the spec" is another technique. In the trial and error technique, the phase of each individual amplifier in the common pool is individually measured using specialized test equipment such as an automatic network analyzer (ANA). Upon identifying an amplifier that has developed phase error, the phase of the amplifier is manually corrected to correspond to the phase of the other amplifiers in the common pool of amplifiers. This method of tracking and correcting the phase of amplifiers is costly and time consuming since each individual amplifier must be physically removed from the MPA, tested and corrected. Physically removing an amplifier from the MPA in which it is embedded can also present new problems such as reliability. Tightening up the spec is a common technique that is used to assure that the amplifiers do not suffer from large phase errors as they age. However, since this spec is imposed on the manufacturer of the amplifier, who can exert little or no control to mitigate for these effects, the cost of compliance is usually very high. A third method that is commonly used by the industry is to simply settle for less; that is, to accept the degraded performance of the lower signal to noise that will result from the phase errors. While this may be acceptable when degradations are small, in many cases it is not possible to ignore their effects and unacceptable performance inevitably results.

In a system where the antenna is receiving rather than transmitting, the need for placing LNAs in an MPA configuration is not as great as in a transmitting antenna system. However, there are some significant advantages in placing the LNAs in an MPA configuration. The main advantage is that it improves reliability. If an LNA is directly connected to an antenna element, then a failure of the LNA and its spares will result in an absence of signal in the direction of the beam that is formed by that antenna element; that is, there will be a hole in the antenna pattern. On the other hand, if the LNAs are placed in an MPA configuration, then a failure of the LNA and its spares will only result in a graceful degradation of the signal to noise ratio, but it will not result in holes in the antenna pattern. A second benefit is that placing LNAs in an MPA configuration will result in all LNAs operating at the same power level. Hence the dynamic range requirements on the LNA can be reduced. This is important in certain applications where the outputs of the LNAs are to be digitized and the number of bits representing the digital signal has to be kept to a minimum. For LNAs configured in an MPA configuration, it is necessary to maintain minimum phase errors, just as in the case of BPAs.

When a large number of antenna elements are involved, such as in a 128 element antenna, then it is not practical to construct a single 128×128 MPA. In such cases, the elements are subdivided into smaller groups where each group has, say, 16 elements for which a 16×16 MPA can be constructed. In such a system, each input can be distributed to only 16 HPAs and performance is not as optimal as that achievable in a true 128×128 MPA. When such a system is used in a phased array antenna system, it is necessary, however, to maintain the same phase along all paths between the beam-forming network and the antenna element; that is, it is necessary that (a) each amplifier has a phase that is identical to that of the other amplifiers within the group, and (b) the phase of each group is identical to the phase of any other group.

Accordingly, there is a need for a unified method of combining a set of amplifiers to accurately distribute power levels to a set of beams, that (A) will result in minimum phase error of the amplifiers,
(B) is simple and practical without requiring the use of a Network Analyzer or complicated de-embedding techniques,
(C) can be applied when the number N of amplifiers is either a power of 2, or more generally, a multiple of 2,
(D) is of low cost and results in minimal impact to existing hardware,
(E) is capable of remotely tracking the phase errors of individual amplifiers in the set of amplifiers over the life of the amplifier,
(F) is capable of remotely correcting the phase of an amplifier in the set of amplifiers whose phase has changed,
(G) is capable of tracking and correcting without interrupting the normal traffic of signals,
(H) can be simplified to use a minimal amount of hardware in the event that the operator is willing to interrupt the normal traffic of signals while performing the phase corrections,
(I) is configurable for both transmit and receive antennas, and is extendable to multiple MPA groups.

Depending upon the embodiment, one or more of the above benefits may be achieved. This invention has a phase correction arrangement that can be used to tune a Multi-port Amplifier (MPA) to have minimum phase error. The invention utilizes the inherent structure (FIG. 5) of the MPA to extract diagnostic information on the phase and gain errors of the amplifiers within the MPA. A test signal is injected, via RF couplers, at certain points in the input network (INET) and monitored, via RF couplers, at certain points in the output network (ONET). The injected test signal is normally a sine wave, but it could be any signal, such as a spread spectrum signal that can be easily identified and its power accurately estimated by integrating over time. In a typical MPA having N high power amplifiers, where N is a power of 2, the test signal is monitored at a single fixed point in the ONET, thereby minimizing the RF loss and the impact of the test on the existing hardware. The signal is injected at the first point of the INET and the phase of a certain amplifier is adjusted until the signal strength at the monitored output is zero; that is, until a null is obtained. The procedure is then repeated at a second point in the INET and a different amplifier's phase is adjusted. By successively injecting RF at various points in the INET, where the impact is minimal due to the low RF levels, all the amplifiers are adjusted in phase to obtain minimum phase errors amongst them. This tuning may be performed without interrupting the normal operation of the MPA. If normal operation can be interrupted, then the test signal may be applied at the external input ports of the MPA and monitored at a single external output port of the MPA, without the need of test couplers, thereby making this technique completely noninvasive and easy to implement on the fly. The invention considers various other cases as variations of the basic scheme; these include a bottoms-up scheme, a top-down scheme, a scheme where is N even but not a power of 2, a scheme that is suitable for receive antenna systems, a related scheme that uses external couplers, and an extension of the scheme that is suitable for a group of MPAs.

In a specific embodiment, the invention provides a method for tuning phase relationships for a multi-port amplifier. The method includes providing a plurality of amplifiers arranged in a multi-port configuration, which has more than two amplifiers. The method includes selecting one of a plurality of test patterns to be input into one or more of the plurality of amplifiers to detect phase information of one or more of the amplifiers and detecting an output signal at a designated output coupled to the plurality of amplifiers. The method also includes adjusting a phase relation of the one or more amplifiers based upon the output signal.

In an alternative specific embodiment, the invention includes a method for tuning a multi-port amplifier. The invention includes providing a plurality of amplifiers arranged in a multi-port configuration, which has more than two amplifiers. The method includes selecting one of a plurality of test patterns to be input into one or more of the plurality of amplifiers to detect a phase information of one of the amplifiers and detecting an output signal at a designated output coupled to the plurality of amplifiers. The method selects a spare amplifier for the one amplifier based upon the output signal and selects one of a plurality of test patterns to be input into the spare amplifier. The method detects an output signal from the spare amplifier at the designated output and adjusts a phase relationship of the spare amplifier based upon the output signal.

Based on the above and foregoing, it can be appreciated that there presently exists a need in the art for a method and system for tracking and controlling the phase of amplifiers in a common pool which overcomes the above-described deficiencies. The present invention was motivated by a desire to overcome the drawbacks and shortcomings of present method and systems for tracking and controlling the phase of amplifiers, and thereby, fulfill this need in the art.

Numerous benefits can be achieved using the present invention over conventional techniques. For example, the present invention provides a method and system for combining a set of amplifiers to distribute power levels as needed to generate a set of beams for a multiple beam transmitting active phased array antenna. The invention also provides a method and system for providing two or more amplifiers to generate the set of beams. Preferably, the invention allows for remotely tracking the phase of individual amplifiers in the set of amplifiers over the life of the amplifier. The invention can also remotely correct the phase of an amplifier in the set of amplifiers whose phase has changed. More preferably, the invention provides a method and system for combining a set of amplifiers to distribute power levels as needed to generate a set of beams for a multiple beam transmitting active phased array antenna, where the phase of amplifiers in the set of amplifiers can be remotely tracked and corrected. Depending upon the embodiment, one or more of these benefits may be achieved. These and other benefits are described throughout the present specification and more particularly below.

The aspects of the present invention that offer these capabilities are described in detail hereinafter with reference to the accompanying figures, which illustrate exemplary embodiments thereof.

BRIEF DESCRIPTION OF THE DRAWINGS

The details of the present invention, both as to its structure and operation can best be understood by referring to the following description with reference to the accompanying drawings in which:

FIG. 5 is a simplified diagram of a multi-port amplifier according to an embodiment of the present invention;

FIGS. 7a–7g illustrate simplified diagrams of a multi-port amplifier according to an embodiment of the present invention;

FIGS. 8a–8g illustrate simplified diagrams of an alternative multi-port amplifier according to an embodiment of the present invention;

FIGS. 13 through 15 illustrate experimental results according to embodiments of the present invention.

DETAILED DESCRIPTION OF THE INVENTION

Figure 1:
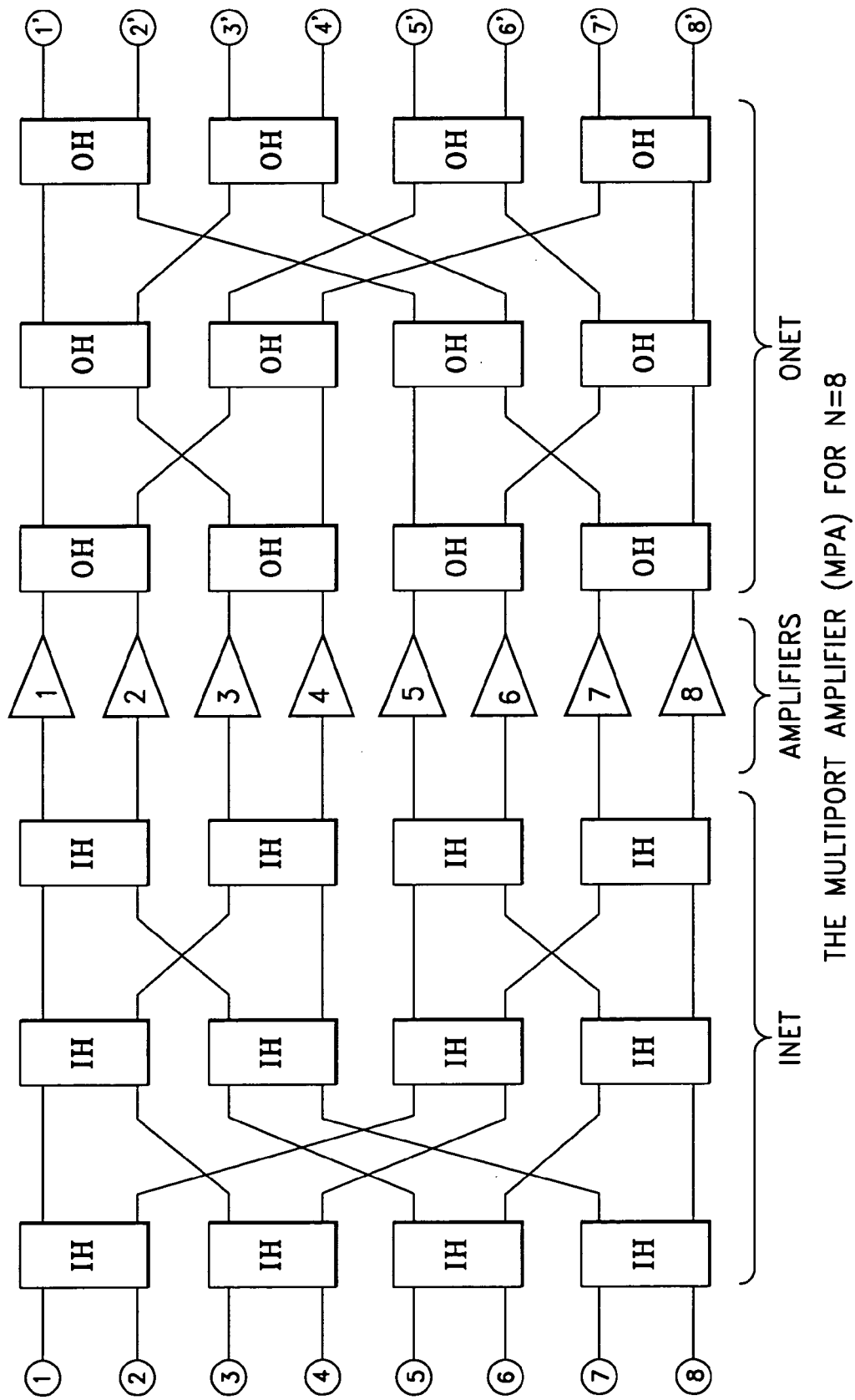
FIG. 1 is a simplified diagram of a multi-port amplifier according to an embodiment of the present invention.
Figure 4:
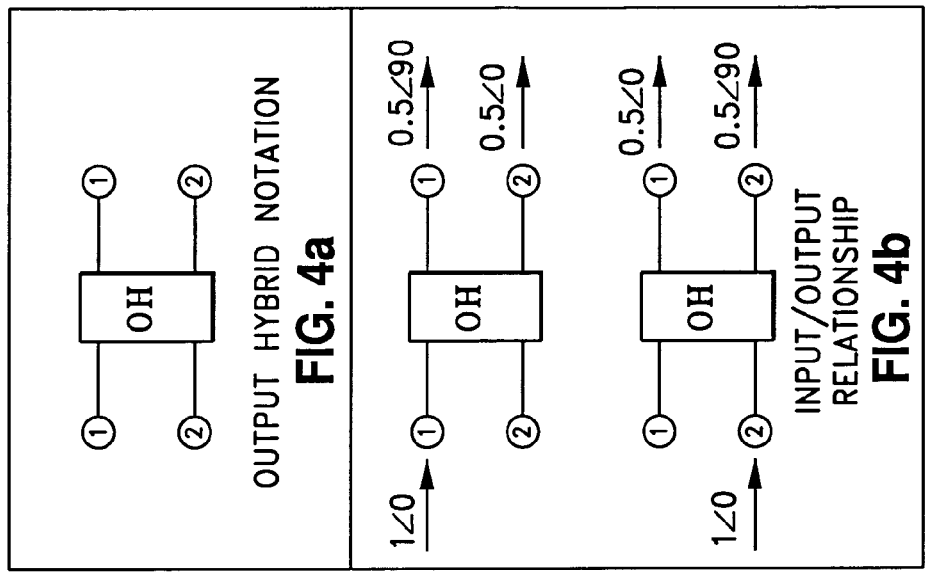
FIG. 4 illustrates simplified diagrams of output hybrids according to embodiments of the present invention.
Figure 3:
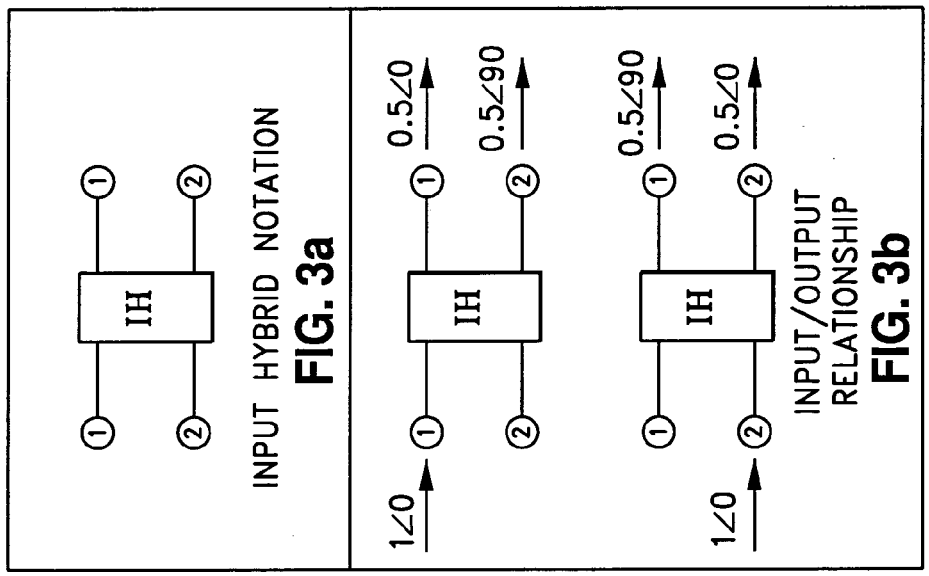
FIG. 3 illustrates simplified diagrams of input hybrids according to embodiments of the present invention.
Figure 2:
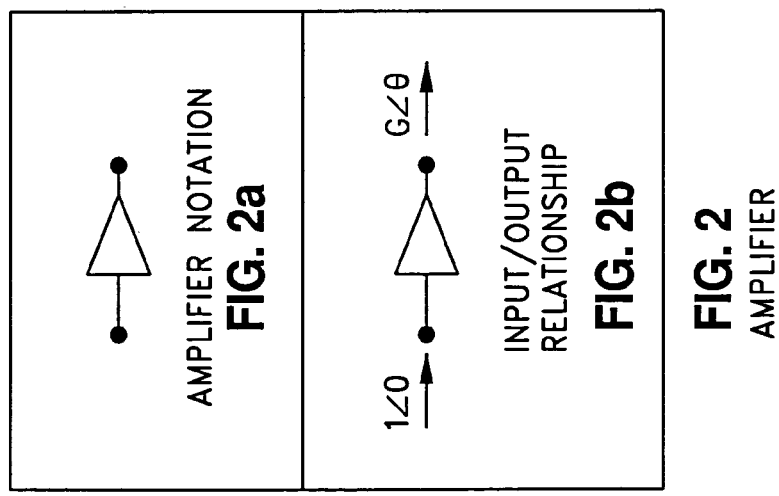
FIG. 2 illustrates simplified diagrams of amplifiers according to embodiments of the present invention.

According to the present invention, techniques for transmitting amplified telecommunication signals from satellites are provided. More particularly, the invention provides a method and system for controlling a phase of an amplifier, which is provided in a multi-port configuration. More particularly, the present invention provides to a method and system for tracking and controlling a phase of amplifiers in a common pool, such as a Multi Port Amplifier system (MPA) using a substantially non-intrusive phase detection technique. But it would be recognized that the invention has a much broader range of applicability.

A clear description of the invention provides certain definitions and notations. These will be followed by certain observations and then followed by a description of the invention, which should not be limited but merely provided for illustration.

A perfectly balanced MPA is defined as one whose amplifiers have equal phase and gain, and whose INET and ONET have ideal characteristics. In a perfectly balanced MPA, a signal applied at an external input port P will only be transferred to the corresponding external output port P' and to no other output port. This type of transfer is possible due to the dynamic relationship of phases established by the INET at the amplifier inputs, the preservation of these phases at the amplifier outputs, and the dynamic reconstruction by the ONET. Hence the connection between P and P' is defined as a dynamic connection (or phase-induced connection), as opposed to a static connection (or hard-line connection), which is defined as one where a wire or cable is present.

In order to describe this invention, the following notation is used.

When there is a need to specifically indicate that a port P belongs to a particular MPA, say MPA I, the notation $P_1(I)$ will be used.

An N×N MPA has N external input ports labeled $P_1$, $P_2$, ..., $P_N$, and N external output ports labeled $P'_1$, $P'_2$, ..., $P'_N$. Here, $P'_1$ is the output port that corresponds with $P_1$, so that, when the MPA is perfectly balanced, a signal applied at $P_1$ will only be transferred to $P'_1$ and to no other external output port. Similarly, $P'_2$ corresponds with $P_2$, $P'_3$ with $P_3$, and so on.

The MPA has internal boundaries. BOUNDARY-1 is the boundary that includes the layer of hybrids closest to the amplifiers. BOUNDARY-2 is the next boundary that includes the next layer of hybrids surrounding BOUNDARY-1. BOUNDARY-3, -4, . . . are similarly defined.

In order to describe the invention with clarity, an 8×8 MPA will be used as an example and FIG. 5 will be referred to. The statements made in connection with this example are applicable to any MPA having $N=2^K$ amplifiers (i.e., the number of amplifiers in the MPA is a power of 2) and hence there is no loss of generality for such MPAs. For MPAs having an even number (excluding powers of 2) of amplifiers, a modification will be made, which will be described later.

At this point, it is worthwhile to recall the desired objectives that have motivated this invention. An objective is that the tuning method should utilize the inherent structure of the MPA to extract diagnostic information about the phase errors of the amplifiers within the MPA. The tuning mechanism should be simple and easy to implement and should preferably require no calibration of the signal power level, power detectors or the phase shifters. This means that (a) the injected power levels do not have to be known; (b) the detection device should not have to report absolute RF power; it merely has to provide a monotonic measure of the RF power; and (c) the phase shifters do not have to be calibrated to have a known phase versus voltage curve; they merely need to have the property of possessing a monotonic known phase versus voltage characteristic. Another objective is that the tuning mechanism should be minimally intrusive to the MPA, so that the performance of the MPA is not degraded by the tuning mechanism. This means that when the MPA is used for transmitting power, the number of monitoring points at the ONET should be kept to a minimum. This is because the power levels in the ONET usually range from hundreds of watts to a few kilowatts and hence even a fraction of a dB of loss in the ONET due to the insertion of a monitoring device can result in a tens or hundreds of watts of lost RF power, which can be very costly for certain applications. By keeping the monitoring devices to a minimum, such tapped losses can be minimized. Monitoring devices should ideally be external to the MPA so that there is the option of eliminating them completely. As for the injection of signals, there is more freedom to add couplers to the INET since the signal level in the INET is usually in milliwatts and the loss of even a few dB of RF power at this point is insignificant. However, a desired goal is to have the option of applying the calibration signals external to the MPA, without the need of test couplers, thereby making this technique completely noninvasive and easy to implement on the fly.

In order to utilize the inherent structure of the MPA to extract diagnostic information, a sequence of observations and deductions will now be made about the 8×8 MPA (FIG. 5).

The boundaries of the MPA are nested: BOUNDARY-1 is nested within BOUNDARY-2, which is nested within BOUNDARY-3.

For the 8×8 MPA, there are four (4) 2×2 MPAs within BOUNDARY-1, two (2) 4×4 MPAs within BOUNDARY-2, and one (1) 8×8 MPA within BOUNDARY-4. The MPAs within BOUNDARY-1 are generically labeled as MPA-I (or I for short), within BOUNDARY-2 are generically labeled as II, and within BOUNDARY-3 are generically labeled as III (which is identical to the original MPA).

Since the boundaries are nested, there are two MPA-I's within MPA-II, and two MPA-II's within MPA-III.

MPA-I has 2 input ports $P_1(I)$ and $P_2(I)$ and two corresponding output ports $P'_1(I)$ and $P'_2(I)$, where the notation established above has been used to indicate that these ports belong to MPA labeled I. These ports are internal to the 8×8 MPA, but are external to the 2×2 MPA labeled I.

MPA-II has 4 input and 4 output ports, $P_n(II)$ and $P'_n(II)$, n=1 to 4, respectively.

(MPA-III has 8 input and 8 output ports, $P_n(III)$ and $P'_n(III)$ n=1 to 8, respectively. Since MPA-III is identical to the original 8×8 MPA, $P_n(III)$ and $P'_n(III)$ are the same as $P_n$ and $P'_n$, respectively, There is a static connection between $P_1(I)$ and each of the input ports $P_n$, n=1 to 4. Similarly, there is a static connection between $P_2(I)$ and each of the input ports $P_n$, n=5 to 8. In a corresponding manner, there is a static connection between $P'_1(I)$ and each of the output ports $P'_n$, n=1 to 4, and between $P'_2(I)$ and each of the output ports $P'_n$, n=5 to 8.

Hence, a signal applied to any of the first 4 input ports of the MPA, namely, $P_n$, n=1 to 4, will reach $P_1(I)$. Correspondingly, a signal present at $P'_1(I)$ will reach each of the output ports $P'_n$, n=1 to 4, but it will not reach the output ports $P'_n$, n=5 to 8. It is also seen that a signal applied to any of the second 4 input ports of the MPA, namely, $P_n$, n=5 to 8, will not reach $P_1(I)$.

MPA I is balanced if and only if a signal at $P_1(I)$ is transferred only to the corresponding port $P'_1(I)$ and none of it to $P'_2(I)$. That is, $P_1(I)$ is dynamically connected to $P'_1(I)$ and it is also dynamically disconnected from $P'_2(I)$. From the observation made above, the signal at $P'_1(I)$ will reach each of the output ports $P'_n$, n=1 to 4, but it will not reach the output ports $P'_n$, n=5 to 8. Conversely, if there is even a trace of this signal at any of the output ports $P'_n$, n=5 to 8, then it must be concluded that this signal is coming from $P'_2(I)$ and that MPA I is not balanced.

Hence, MPA I is balanced if and only if a signal at $P_1(I)$ results in a null at the output port $P'_8$. Since this is true for all four MPA I's in BOUNDARY-1, a necessary and sufficient condition for any one of these MPA I's to be balanced is to verify that when a signal is present at $P_1(I)$ of this MPA I, there results a null at the output port $P'_8$, provided there are no signals present at any other input ports of BOUNDARY-1.

Therefore, to balance MPA I, it is first verified that a signal is present at $P_1(I)$ of this MPA I, and that no signals are present at any other input ports of BOUNDARY-1. The signal power is monitored at the output port $P'_8$. Since MPA I is a 2×2 MPA with 2 amplifiers, the phase of one of its amplifiers is varied until the signal strength at $P'_8$ goes to zero; i.e., until a null is observed at the monitoring point. Now, the phase shifter's phase versus voltage characteristic is monotonic and the monitoring device's RF power measured (usually as a voltage) versus RF power present is also monotonic. Hence by comparing the present value of RF power measured with the previous value, the direction of the phase voltage for obtaining the null is determined, and it is always the same until the null is reached. Going past the null will result in the present value of RF power measured to be higher than the previous value and thus the proper stopping point is easily established without the need for a lengthy procedure. Also, it will be noted that there is no need to calibrate the phase shifter of the RF power-measuring device, nor is there a need for these devices to be linear. It is only necessary that these devices have monotonic transfer curves and, in the phase shifter, that the voltage corresponding to the null is reachable, which are properties that are easy to meet.

Figure 6:
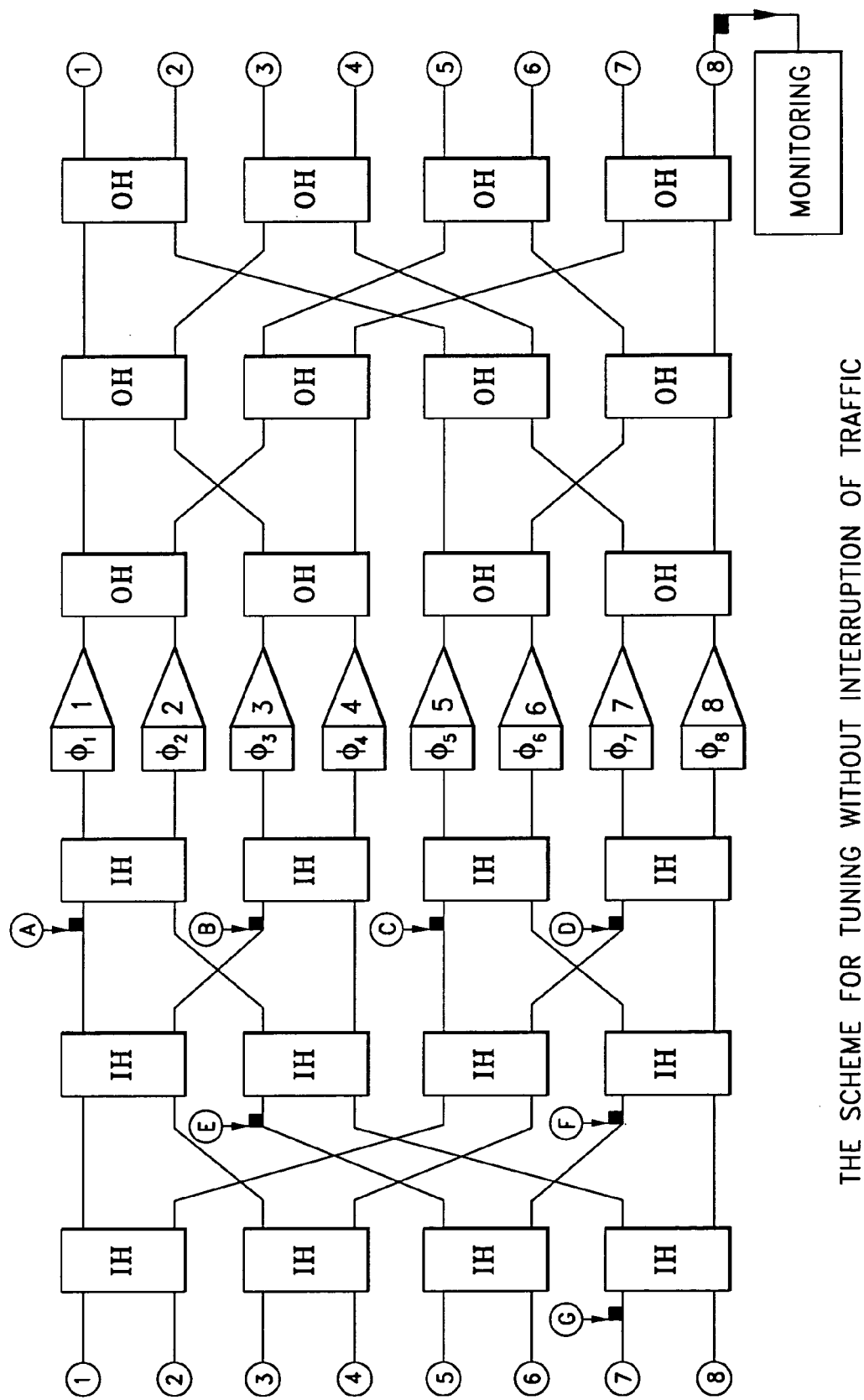
FIG. 6 is a simplified diagram of a schematic for a tuning method according to an embodiment of the present invention.

It is seen above that to balance the MPAs in BOUNDARY-1, generically called MPA I, it is necessary to first verify that a signal is present at $P_1(I)$ of MPA I, and that no signals are present at any other input ports of BOUNDARY-1. This is accomplished in one of two methods: (a) by incorporating couplers in the INET at $P_1(I)$ of MPA I (FIG. 6), or (b) by placing a signal at anyone of the exterior ports $P_n$, n=1 to 4, since it was shown earlier that there is a static connection between $P_1(I)$ and the ports $P_n$, n=1 to 4. If method (a) is adopted, then four such couplers are needed since there are four MPA I's within BOUNDARY-1, and they are usually 10 or 20 dB couplers that couple the injected signal very lightly to the INET. The injected signal is preferably a sine wave which has the property that the bandwidth it occupies is almost zero and hence its power can be estimated using an integrator, even if it is mixed with regular traffic. Therefore method (a) can be used even in the presence of regular traffic, without interrupting it. If method (b) is adopted, then couplers are not needed at the INET. However, when a signal is placed at the exterior port $P_1$, say, it reaches all eight ports $P_1(I)$ and hence it is not only present at the intended $P_1(I)$ of BOUNDARY-1 of the desired MPA I, but also at the three other $P_1(I)$'s of BOUNDARY-1 belonging to the other three MPA I's. Therefore the required condition that no signals be present at any other input ports of BOUNDARY-1 is not exactly satisfied. However, the intent of this condition can be satisfied by simply turning off the amplifiers of the other three MPA I's, or by reducing the gain of these amplifiers by say 20 dB. In this way, these other signals will not go forward to the observation port $P'_8$. However, turning these amplifiers off requires interrupting normal traffic.

Having balanced all the four MPAs within BOUNDARY-1, it is well worth making a few points before proceeding further. Firstly, if $P'_8$ is chosen as the observation point, then balancing the MPAs within BOUNDARY-1 must necessarily use only ports $P_1(I)$, since a test signal applied to any port $P_2(I)$, will transfer power to $P'_8$ and a null will not be achievable. Secondly, and very importantly, since each MPA I is balanced, a signal applied at $P_1(I)$ of MPA I, will result in a null at $P'_8$, and consequently, any combination of signals applied to the four ports $P_1(I)$ of BOUNDARY-1, will still result in a null at $P_8$. Since BOUNDARY-1 is nested within the outer boundaries, such as BOUNDARY-2 and -3, a signal applied at the input port of any of these outer boundaries, must necessarily pass through BOUNDARY-1, and hence will necessarily be applied to either ports $P_1(I)$ or $P_2(I)$ of this boundary. But, any attempt to balance the MPAs within the outer boundaries, must not use methods that will result in any combination of test signals being effectively applied only to the ports $P_1(I)$ of BOUNDARY-1, since as just noted, the result will always be a null at $P'_8$, even if the MPAs within the outer boundaries are not balanced to each other. In other words, the efficacy of $P_1(I)$ for balancing the MPAs has been used up. Since the four ports $P_1(I)$ of BOUNDARY-1 are statically connected to the first four input ports, namely $P_n$, n=1 to 4, any combination of test signals that can be traced to these first four ports are likewise ineffective for further balancing the MPAs.

Balancing the MPAs within BOUNDARY-2 must build on the success of having balanced all MPAs within BOUNDARY-1. There are two such BOUNDARY-2 MPAs, each 4×4, and generically denoted by MPA II. Each MPA II consists of two MPA I's each of which has been balanced at the preceding step. Hence to balance MPA II, it is only necessary to equalize the phases of the two MPA I's to each other.

To balance an MPA II, the observations are similar to the ones made for MPA I. MPA II has 4 input and 4 output ports, $P_n(II)$ and $P'_n(II)$, n=1 to 4, respectively.

There is a static connection between $P_1(II)$ and each of the input ports $P_n$, n=1 to 2. Similarly, there is a static connection between $P_2(II)$ and each of the input ports $P_n$, n=3 to 4, between $P_3(II)$ and each of the input ports $P_n$, n=5 to 6, and between $P_4(II)$ and each of the input ports $P_n$, n=7 to 8. In a corresponding manner, there is a static connection between $P'_1(II)$ and each of the output ports $P'_n$, n=1 to 2, between $P'_1(II)$ and each of the output ports $P'_n$, n=3 to 4, between $P_3(II)$ and each of the output ports $P'_n$, n=5 to 6, and between $P_4(II)$ and each of the output ports $P'_n$, n=7 to 8.

Of the four possible ports $P_1(II)$, $P_2(II)$, $P_3(II)$ and $P_4(II)$, only $P_3(II)$ is suitable for applying test signals to. $P_1(II)$ and $P_2(II)$ are statically connected to the first four MPA ports, namely $P_n$, n=1 to 4, and as noted previously, applying test signals that are connected to the first four ports is ineffective past BOUNDARY-1. When MPA II is balanced, $P_4(II)$ is dynamically connected to $P'_4(II)$ which is statically connected to the observation port $P'_8$. Hence a signal applied to $P_4(II)$ will not result in a null at $P'_8$. Hence only $P_3(II)$ is suitable for applying test signals to.

MPA II is balanced if and only if a signal at $P_3(II)$ is transferred only to the corresponding port $P'_3(I)$ and none of it to the other output ports, namely $P'_1(II)$, $P'_2(II)$ and $P_4(II)$. That is, $P_3(II)$ is dynamically connected to $P'_3(I)$ and it is also dynamically disconnected from the other output ports. From the observation made above, the signal at $P'_3(I)$ will reach each of the output ports $P'_n$, n=5 to 6, but it will not reach the other output ports, specifically, the observation port $P'_8$. Conversely, if there is even a trace of this signal at $P'_8$; then it must be concluded that this signal is coming from one of the other output ports, $P'_4(II)$ in this case, and that MPA II is not balanced.

Hence, MPA II is balanced if and only if a signal at $P_3(II)$ results in a null at the output port $P'_8$. Since this is true for all the two MPA II's in BOUNDARY-2, a necessary and sufficient condition for any of one these MPA II to be balanced is to verify that when a signal is present at $P_3(II)$ of this MPA II, there results a null at the output port $P'_8$, provided there are no signals present at any other input ports of BOUNDARY-2.

Therefore, to balance MPA II, it is first verified that a signal is present at $P_3(II)$ of this MPA II, and that no signals are present at any other input ports of BOUNDARY-2. The signal power is monitored at the output port $P'_8$. Since MPA II is a 4×4 MPA consisting of two balanced MPA I's, the phase of one of these MPA I's must be varied until the signal strength at $P'_8$ goes to zero; i.e. until a null is observed at the monitoring point. However, MPA I has 2 amplifiers within it whose phases have been equalized since MPA I is balanced, and any attempt to vary the phase of MPA I to balance MPA II must ensure that MPA I stays balanced. If the phase shifters used in these amplifiers are perfectly calibrated, then the procedure is easy: simply increment or decrement the phases of the two amplifiers in tandem until a null is obtained. Adjusting the phase shifter to produce a null at $P'_8$ is done in the same manner as was done for balancing the BOUNDARY-1 MPAs. The application of the proper signal at the two locations $P_3(II)$ is also done in the same manner as for balancing the, BOUNDARY-1 MPAs; namely, by either injecting the signal using couplers at these locations (FIG. 6), or by applying a signal at one of the input ports $P_n$, n=5 to 6 with all MPA II's turned off except the one that is being balanced. The former method uses couplers and requires a test source, but can be performed without interrupting normal traffic. The latter method does not require couplers and can use the signal itself as a test source, but it requires interruption of traffic.

As may be observed from the above discussion, to balance MPA II, it is apparently necessary to use calibrated phase shifters, in order to shift two phase shifters in tandem. Further reflection shows that this is unnecessary. Assume MPA I is balanced and that it is necessary to shift the phase of its two amplifiers by the same amount. The phase versus voltage transfer curve for the two phase shifters is unknown. To perform this task, the voltage of each phase shifter is changed by a small amount, say $\Delta X$, and the change in the RF power measured at $P'_8$ is noted, say $\Delta Y_1$; for phase shifter 1 and $\Delta Y_2$ for phase shifter 2. Then it is clear that to get the same phase shift from the phase shifters 1 and 2 it is only necessary to change their voltages in the proportion of $1/\Delta Y_1$ and $1/\Delta Y_2$ respectively. Thus, it is not necessary to have calibrated phase shifters to balance MPA II. This conclusion and the procedure outlined holds true even when several more phase shifters have to be shifted in tandem, as is required when MPA III has to be balanced. All that is required is to determine the sensitivity of each phase shifter by observing the effect it produces on the relative change of the power measured at $P'_8$.

Having balanced the four MPAs within BOUNDARY-2, it is once again worth making a few points before proceeding further. The method for balancing MPA II is similar to that for balancing MPA I with two extra notes of caution. Firstly, the test ports used for balancing MPA II must be so chosen that no test signal is incident on the test ports used previously for balancing MPA I. Secondly, if uncalibrated phase shifters are used, a sensitivity test must be performed prior to shifting the phases of two or more phase shifters in tandem. Balancing the MPAs within BOUNDARY-3 is done exactly the same manner as balancing the MPAs within BOUNDARY-2.

BOUNDARY-3 has one MPA, denoted by MPA III, which is an 8×8 MPA. This MPA has eight input ports, $P_n$(III), n=1 to 8, which are the same as $P_n$, n=1 to 8.

Just as in the case of BOUNDARY-2 MPAs, it is first necessary to determine the proper port to apply the test signal. It is easy to see that $P_7$ is the correct port to use since it was never previously used, and $P'_7$ is statically disconnected from the observation port $P'_8$. Therefore when MPA III is balanced, $P_7$ is dynamically connected to $P'_7$ and dynamically disconnected from $P'_8$ and hence MPA III is balanced when a signal applied at $P_7$ results in a null at $P'_8$. MPA III has two MPA II's within it, each of which has 4 amplifiers. Balancing MPA III therefore requires the tandem shifting all of the phases of the 4 amplifier phase shifters within one of these MPA IIs. As observed previously, it is not necessary that these phase shifters be calibrated. A simple sensitivity measurement of the phase shifters is all that is required. Thus the BOUNDARY-3 MPA, which is also the original 8×8 MPA, is balanced.

NOTE: Sometimes, in the drawings, the hybrids of the boundary layers of one MPA are shown interleaved with the hybrids of another MPA. This is simply an artifact of the drawing and the interconnections may be redrawn to show all the hybrids of the first MPA on the top, followed by hybrids of the second MPA, and so on. Therefore the above arguments are general and apply to any MPA that is a power of 2.

The above mathematical proof of this invention also provides some further insight into tuning the MPA. The above method shows that tuning of the MPAs start from the inner boundary, namely, BOUNDARY-1 and proceeds sequentially outward towards BOUNDARY-3. This method will be called the bottoms-up method of tuning. When the bottoms-up method is performed using only the external ports, as indicated in the proof above, the sequence of tuning steps in FIG. 7, namely FIGS. 7a to 7f, results. The first four steps (FIGS. 7a to 7d) show the BOUNDARY1 MPAs being balanced. The amplifiers shown shaded are turned ON and the other amplifiers are turned OFF. Note that the test signal is applied at the same input port, namely port $P_1$, in these first four steps. It was shown above that a signal at $P_1$ is statically connected to each $P_1$ (I) of the BOUNDARY-1 MPAs. By turning on only the particular MPA I that is being balanced, and turning off all the other MPA I's that are not being balanced in the step, it is assured that only the particular MPA will be involved, without interference from the other MPAs. In steps 5 and 6 (FIGS. 7e to 7f), the BOUNDARY-2 MPAs are balanced, and in step 7 (FIG. 7f), the BOUNDARY-3 MPA is balanced. It will be recalled that balancing the BOUNDARY-3 and MPA requires the tandem shifting of phase, for which a method was proposed above that determines the sensitivities of the various phase shifters involved.

The dual of the bottoms-up method is the top-down method shown in FIG. 8. In this method the tuning starts from the outer boundary (BOUNDARY-3 in this case) and proceeds inward to BOUNDARY-1. Since the two MPA II's within BOUNDARY-3 are identical, with the first amplifier in identical positions, and since these two MPAs are connected by hybrids, it can be seen that (a) by applying a signal to $P_7$, (b) turning on only the first two amplifiers, namely amplifiers 1 and 5, of the two MPAs, and (c) monitoring the signal at $P'_8$, the phases of amplifiers 1 and 5 can be equalized (FIG. 8a); that is $\phi_5 = \phi_1$. Note that the phases of the other amplifiers are not equalized at this step; that will happen in the succeeding steps. Moving inward to BOUNDARY-2, and the test signal at $P_5$, the same procedure is applied to amplifiers 1 and 3 (FIG. 8b) of the first two BOUNDARY-2 MPAs, resulting in $\phi_3 = \phi_1$, and to amplifiers 5 and 7 (FIG. 8c) of the next two BOUNDARY-2 MPAs, resulting in $\phi_1 = \phi_5$. Since it is necessary only to shift $\phi_3$ and $\phi_7$ to achieve these equalities, without touching $\phi_1$ or $\phi_5$, the previously established equality $\phi_5 = \phi_1$ is preserved, yielding the new stronger equality: $\phi_3 = \phi_1 = \phi_5 = \phi_7$. Moving inward to BOUNDARY-1 (FIGS. 8d to 8f), and applying the signal to $P_1$, the procedure is applied again, to get $\phi_2 = \phi_1$, $\phi_4 = \phi_3$, $\phi_6 = \phi_5$ and $\phi_8 = \phi_7$. Once again since only the phases $\phi_2$, $\phi_4$, $\phi_6$, and $\phi_8$ are shifted with $\phi_1$, $\phi_3$, $\phi_5$ and $\phi_7$ untouched, the desired equality $\phi_1 = \phi_2 = \phi_3 = \phi_4 = \phi_5 = \phi_6 = \phi_7 = \phi_8$ will result. It will be noted that the top-down method does not require the tandem shifting of phases. An additional advantage of the top-down method is that it is not necessary to have the three different injection ports $P_7$, $P_5$, and $P_1$. It is sufficient to have just one injection port, $P_1$ throughout. This is because $P_1$ has static connectivity to all amplifiers in the MPA and, unlike the bottoms-up approach, its efficacy does not diminish during the tuning process.

Figure 9:
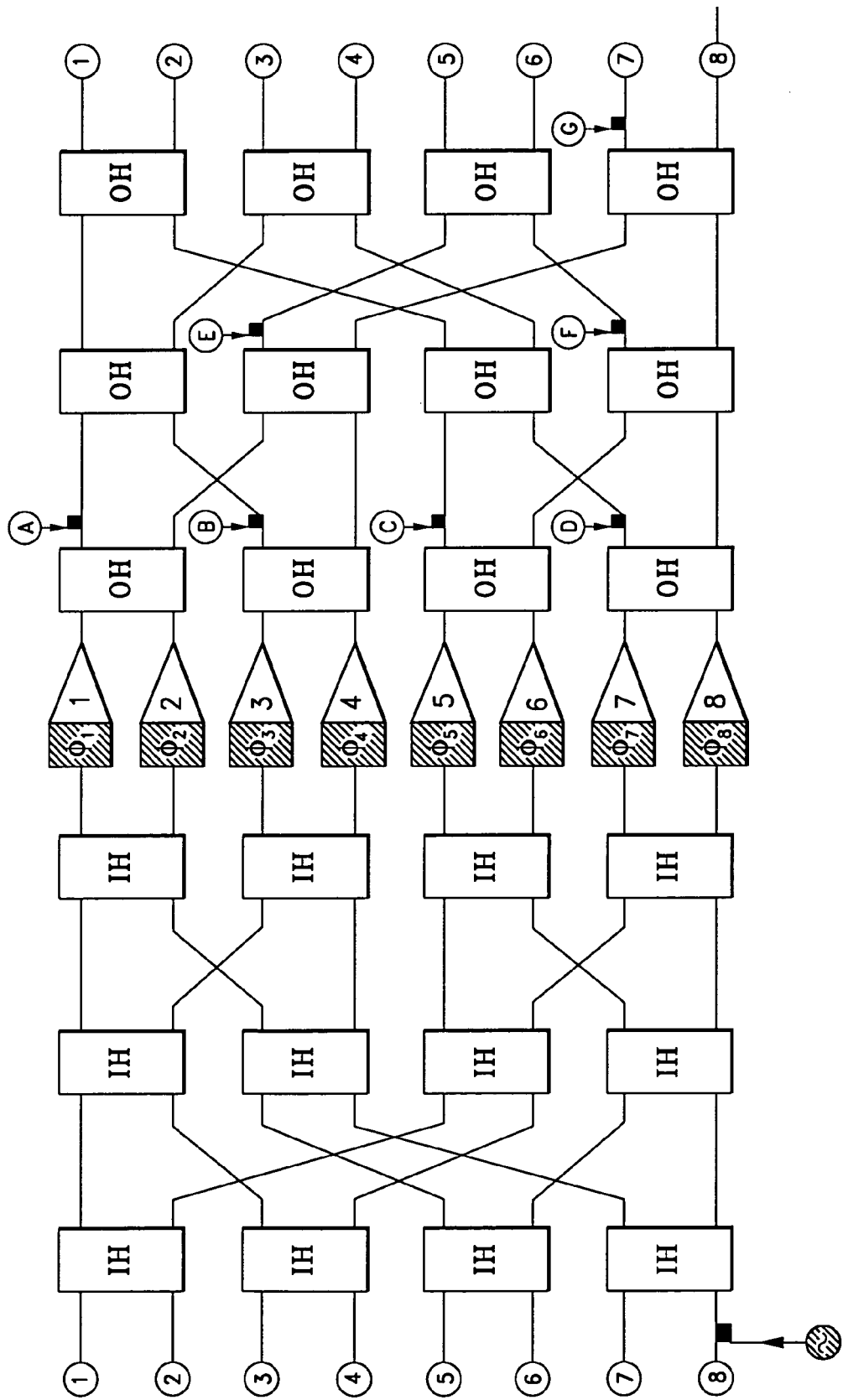
FIG. 9 is a simplified diagram of a shifting test and monitor points for a multipoint amplifier according to an embodiment of the present invention.

Due to the symmetry between input and output, the roles of the injection ports and observation ports may be interchanged (FIG. 9). Thus there is one input injection port in the INET placed at $P_8$ and monitoring ports, placed in the ONET externally at $P'_1$, $P'_5$, and $P'_7$ or internally at $P'_1$(I), $P'_3$(II) and at $P'_7$, and the same procedure of balancing the MPAs can be performed. This duality is useful for applications that involve LNAs since in such applications it is necessary to leave the input side of the MPA as undisturbed as possible due to the very weak signal strengths present.

Figure 10:
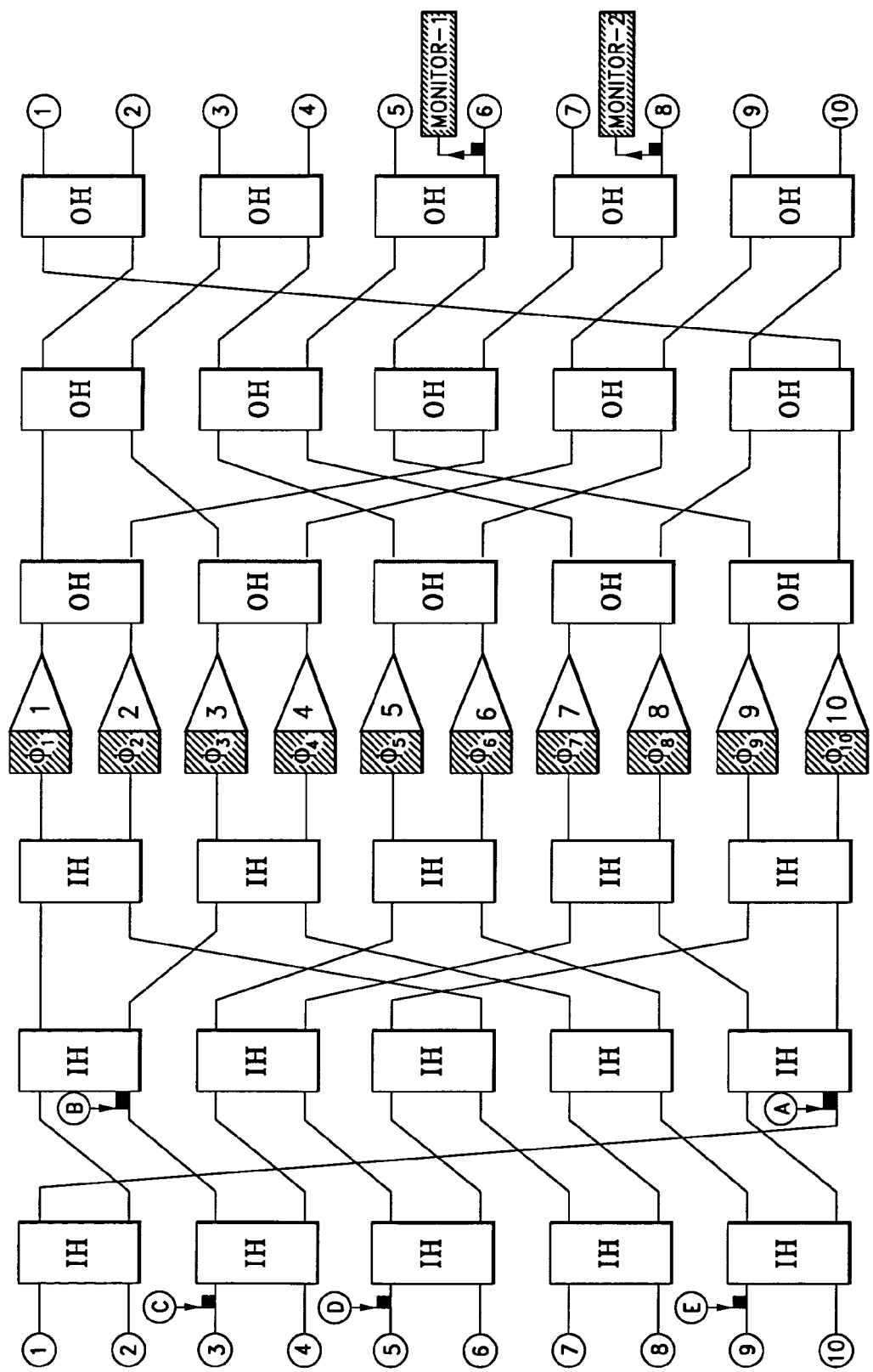
FIG. 10 is a simplified diagram of tuning a 10 by 10 multi port amplifier according to an embodiment of the present invention.

The balancing of MPAs where the number of amplifiers, N, is even but not a power of 2, a similar procedure may be used, but it must be modified (FIG. 10). If there is only one monitoring point, and it is at $P'_{10}$, then it is seen from this figure that amplifiers 1 and 2 can never be balanced, because they are statically disconnected from $P'_{10}$. Therefore, at least 2 monitoring points are required. Using 2 monitoring points, rather than 1, multiplies the number of test possibilities by 2, which results in over testing. The ad hoc scheme shown in FIG. 10 avoids this, with a total of 5 test points at BOUNDARY-2 and BOUNDARY-3, and none at BOUNDARY-1. Furthermore, it can easily be shown that such MPAs can also be balanced using external ports only, using either the bottoms-up or the top down approach.

Figure 11:
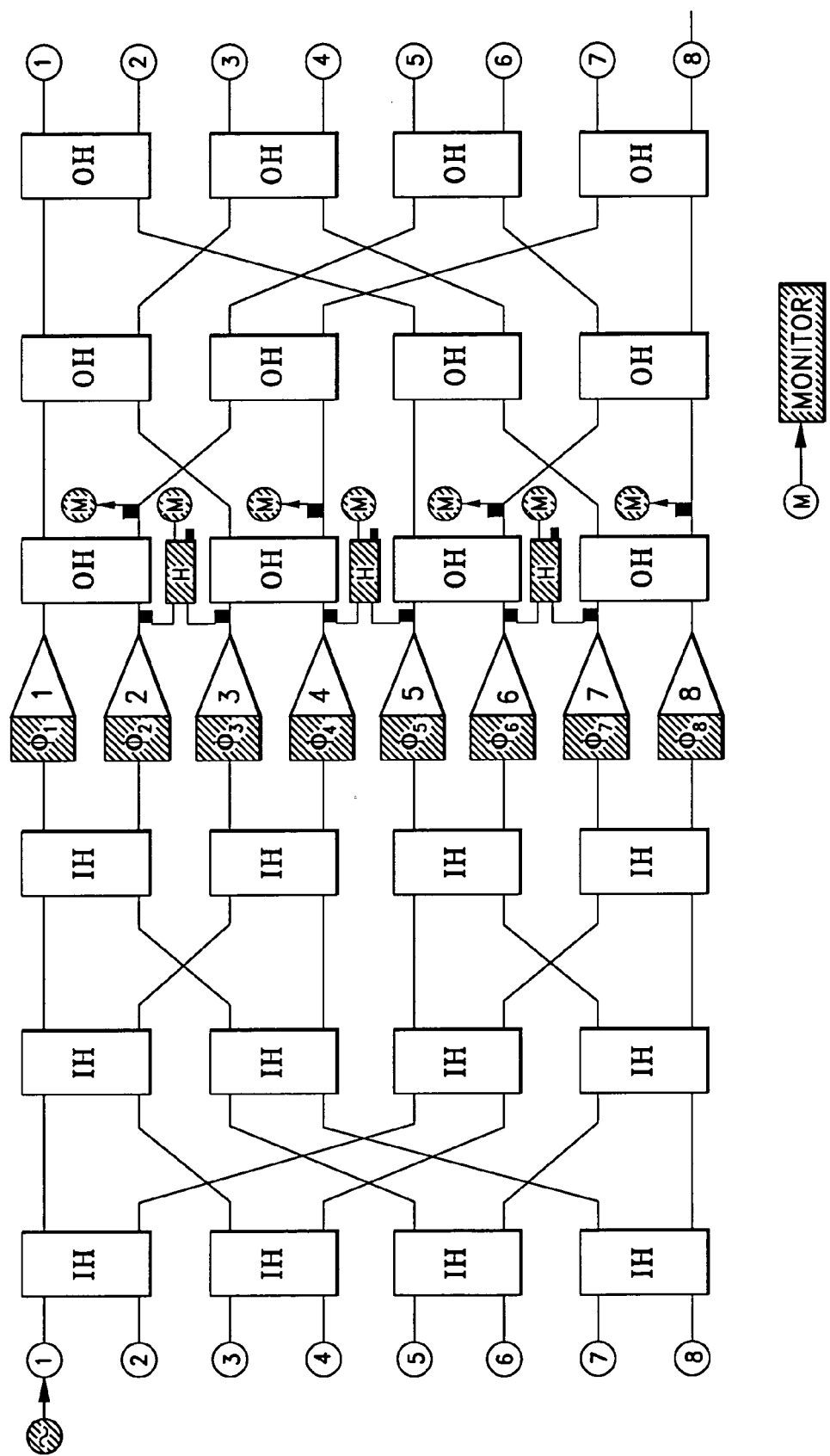
FIG. 11 is a simplified diagram of a multi-port amplifier including external hybrids according to an embodiment of the present invention.

A different method of testing MPAs is shown in FIG. 11. Here external hybrids (indicated by the label "H") are used for tuning, and not all of the internal structure of the MPA is made use of. Such an idea has its use in that it is the starting point in the tuning of a group of MPAs, which may be needed when the number of amplifiers involved is too large for a single MPA to handle. In the scheme shown in FIG. 11, the test signal is applied at one of the external input ports. The INET ensures that this signal is presented to each of the amplifiers. The pair-wise balance of amplifiers 1 and 2 is assured by seeking a null at the first test point M. Then an external hybrid (indicated by the label "H") is used to equalize the phases of amplifiers 2 and 3. So now the equality $\phi_1=\phi_2=\phi_3$ is obtained. Next a null is sought in the second test point M resulting in amplifiers 3 and 4 being balanced. This extends the above equality to $\phi_1=\phi_2=\phi_3=\phi_4$. The process may thus be continued to obtain the phase equality of all the amplifiers.

Figure 12:
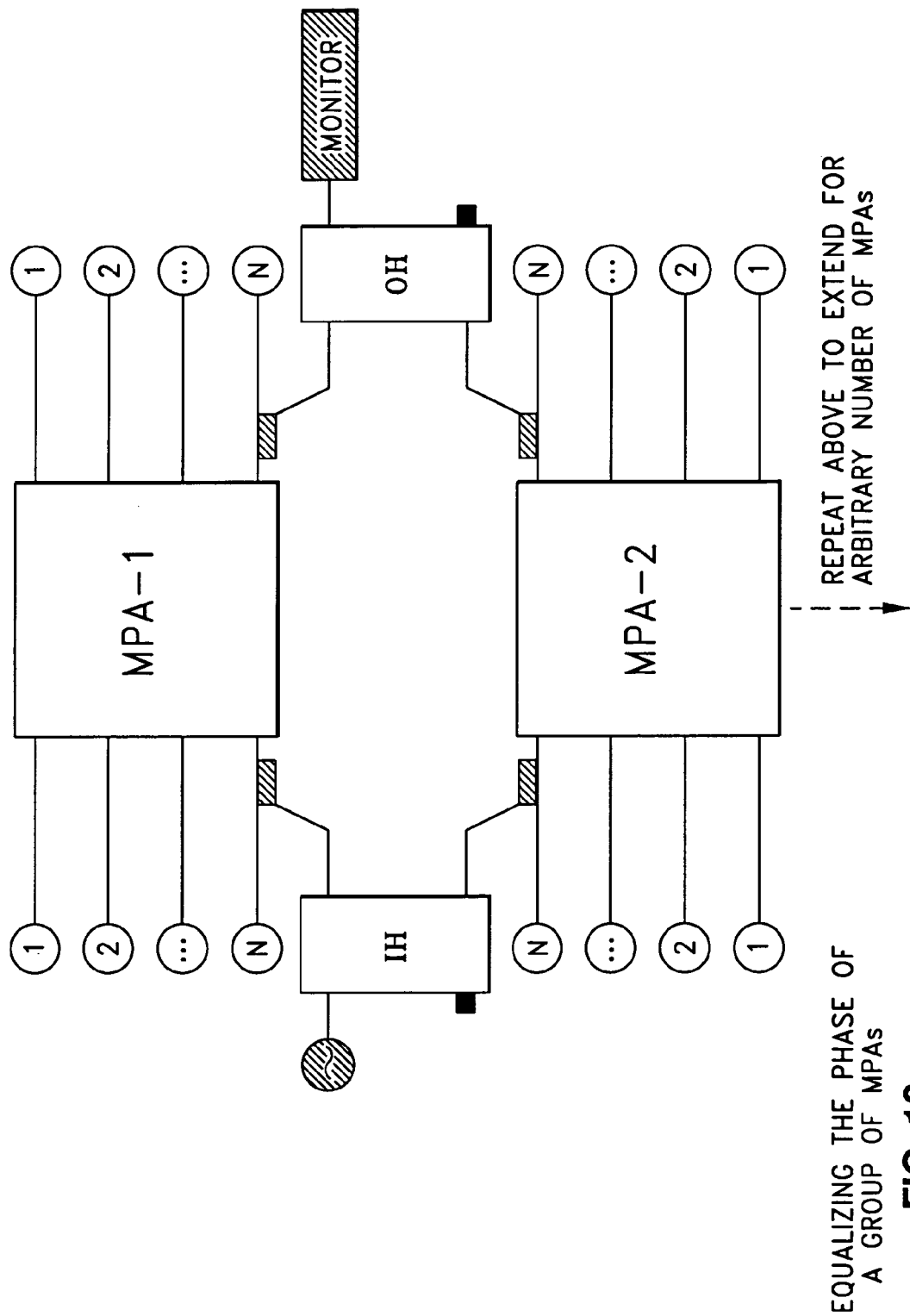
FIG. 12 is a simplified diagram of equalizing phases of a group of multi-port amplifiers according to an embodiment of the present invention.

The above method may be used to equalize the phases of a group of MPAs as shown in FIG. 12. Here, MPA 1 is first balanced using any of the techniques proposed above. Then the phase of one amplifier of MPA 2 is equalized with that of the corresponding amplifier of MPA 1 by using external hybrids as shown and by simply turning all other amplifiers off. Keeping this phase fixed, all the amplifiers of MPA 2 are equalized to it by balancing MPA 2 using the same method used for balancing MPA 1. This process is continued until all MPAs in the group are balanced.

A mathematical proof of the method behind the invention was provided above. However, it is also necessary to verify the performance of the invention by experiments and computer simulations. The main factor that can limit the performance of this invention is the accuracy of the INET and the ONET. The INET and ONET are built from hybrids that are required to have the quadrature relationship, that is, the output ports should have a phase offset of 90°. Some hybrids such as coupled-line hybrids have this quadrature relationship by virtue of the physics that governs their operation. Other hybrids such as branch-line hybrids obtain this relationship by mechanical design of their lengths and hence the quadrature relationship cannot be guaranteed for such hybrids. Even if the quadrature relationship is obtained by each hybrid, the interconnections between them require some transmission line length. If these transmission lines do not all have equal length for between the MPAs at each boundary, the quadrature relationship can once again not be met perfectly. A second reason for an imperfect quadrature relationship is the return loss between hybrids. As the signal travels between hybrids, along the transmission lines, there is some refection at the interfaces which causes small portions of the signal to make multiple back and forth trips which effectively results in some randomness in the signal phases as the signal travels between hybrids. Hence the effect of all this can be modeled with a computer simulation by using Monte Carlo methods for the random departures from quadrature. It is also necessary to simulate departures from exact power division. In an ideal hybrid, exactly the two output ports receive equal power. But this is once again not necessarily true. For most microwave applications the hybrids used in the INETs and ONETs have about 5 degrees of phase error and 0.25 dB of power gain error, peak to peak.

It is clear from the mathematical proof of the correctness of the invention that if the hybrids are perfect and the signals are measured correctly, then the phases all amplifiers can be equalized perfectly. By applying the method of the invention, the amplifiers will obtain certain phases which may not all be equal, principally because of the imperfections of the hybrids. Therefore to determine the practical performance of the invention, it is necessary to determine how much the phases differ from equality, and the implication of this difference of phase from equality.

With these considerations in mind, computer simulations were performed for a 16×16 MPA, which is an MPA that is even more complex than the 8×8 MPA that was used previously to explain the invention. FIG. 13 shows the mean phase error between the 16 amplifiers versus the quality of hybrid used, due to the application of the method if this invention. For the typical hybrid with 5 degrees of phase error and 0.25 dB of power gain error, peak to peak, the expected mean variation (or standard deviation) of phase is 3.5 degrees. Note that this is not the peak to peak phase variation, which will be much higher. For a uniform distribution, the peak to peak variation is about 4 times ($1/\sqrt{12}$) the standard deviation. This means that the amplifier phase errors are approximately 3 times ($=3\times3.5\div5$) that of each hybrid. This makes sense since (a) there are four boundaries (a factor of 4), (b) roughly half the hybrids take part in up the phase (a factor of ½) and (c) the MPA performs an averaging with its INET and ONET (a factor of $\sqrt{2}=1.4$).

FIG. 14 shows the isolation between the MPA ports versus the quality of hybrid used, due to application of the method if this invention. It is seen that the mean isolation is approximately 34 dB for the typical hybrid with 5 degrees of phase error and 0.25 dB of power gain error, peak to peak. A practical value of isolation is about 20 dB; hence this invention far exceeds the practical values. It was separately verified that if perfect amplifiers are used (i.e. all with equal phases), the mean isolation would be 37 dB. In general, it has been found that the loss of isolation is approximately 3 dB from the perfect amplifier case, for a wide range of isolations commonly specified.

The final verification of the invention is by experiment. The experiment was performed on a 16×16 MPA using and the method was automated by programming the computer to automatically apply phases to the phase shifters and make measurements. The measurement process was further improved by using graphical user interfaces to enhance the interaction with the operator. The results are shown in FIG. 15. The signals were applied at the external ports using the top-down method. The graph is a measured response of the signal strength at $P'_{16}$ (the observation port of the 16×16 MPA) versus the phase of amplifier 13. Though not shown here, the graphs of the other amplifiers are similarly obtained. The final phases of the amplifiers and the null depths are shown in the table. It is seen that the average phase error is approximately 5°, and most of the nulls are in excess of 30 dB.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An apparatus for phase correction of a parallel amplifier arrangement, the apparatus comprising:
   N amplifiers configured in a parallel arrangement, each of the amplifiers including an input port and an output port, where N is an even integer greater than two;
   N, or fewer, input ports of the apparatus, where N equals the number of amplifiers;
   N, or fewer, output ports of the apparatus, where N equals the number of amplifiers;
   N, or fewer, phase shifters coupled to the N amplifiers, each phase shifter being coupled to one of the N amplifiers;
   M input hybrids coupled to the input ports of the apparatus and to the N input ports of the amplifiers, where $M=(N/2)Int(\log_2 N)$, and where $Int(\log_2 N)$ is defined as a greatest integer less than or equal to $\log_2 N$;
   M output hybrids coupled to the N output ports of the amplifiers and to the output ports of the apparatus;
   one or more test signal injection sites coupled to the M input hybrids, each of the test signal injection sites being coupled to selected ports of the input hybrids, each of the test signal injection sites being configured to receive an RF test signal to associate a phase relationship of at least two of the N amplifiers; and
   one or more test signal monitoring sites coupled to selected ports of the output hybrids, the one or more test signal monitoring sites being adapted to provide an output signal associated with the RF test signal for the phase relationship of at least two of the N amplifiers.

2. The apparatus of claim 1 wherein N is equal to $2^n$, where n is an integer greater than 1.

3. The apparatus of claim 1 wherein the number of phase shifters is equal to either N–1 or N.

4. The apparatus of claim 1 wherein the one or more test signal monitoring sites are configured as a single output coupler, the single output coupler being configured at one of the output ports of the apparatus to reduce any possible signal loss from other signals provided through the amplifiers.

5. The apparatus of claim 1 wherein the one or more test signal injection sites include N–1 input couplers, where the input couplers are configured within the input hybrids to maximize an efficacy of the phase correction procedure.

6. The apparatus of claim 1 wherein the one or more test signal injection sites are located at the input ports of the apparatus.

7. The apparatus of claim 1 wherein the one or more test signal monitoring sites are two output couplers located at the output ports of the apparatus.

8. The apparatus of claim 1 wherein the output signal is a null signal.

9. The apparatus of claim 1 wherein the phase relationship is an equal phase relationship.

10. A method for tuning phase relationships for a multi-port amplifier, the method comprising:
    providing a multi-port amplifier having N amplifiers where N is an even integer greater than two, the multi-port amplifier including N or fewer input ports and N or fewer output ports;
    providing M input hybrids coupled to the N, or fewer, input ports of the multi-port amplifier, where $M=(N/2)Int(\log_2 N)$, and where $Int(\log_2 N)$ is defined as a greatest integer less than or equal to $\log_2 N$;
    selecting one of a plurality of test patterns to be input as a test signal into one or more test signal injection sites to detect phase information of one or more of the amplifiers;
    detecting an output signal at one or more test signal monitoring sites at a designated output coupled to the amplifiers; and
    adjusting a phase relationship of the amplifiers based upon the output signal.

11. The method of claim 10 wherein the designated output is a single output location for the amplifiers, when N equals $2^n$, where n is an integer greater than 1.

12. The method of claim 10 wherein the method is accomplished without interrupting a normal signal traffic and without disturbing the amplifiers, and wherein the test signal, which is uncorrelated with the normal signal traffic, is injected into selected input hybrids via test couplers, one at a time according to a selected schedule, and monitored for a null value at the one or more test signal monitoring sites.

13. The method of claim 12 wherein the selected schedule follows a bottoms-up approach, wherein the multi-port amplifier is viewed as a sequence of nested layers of multi-port amplifiers, and the balancing of the multi-port amplifier is performed by balancing an inner layer first, and proceeding recursively towards an outer layer.

14. The method of claim 10 wherein the method is accomplished by interrupting a normal signal traffic, wherein the test signal is injected at an input port of the multi-port amplifier, selected amplifiers are turned on or off according to a selected schedule, and wherein the output signal is monitored for a null value at the one or more test signal monitoring sites.

15. The method of claim 14 wherein the selected schedule follows a bottoms-up approach, wherein the multi-port amplifier is viewed as a sequence of nested layers of multi-port amplifiers, and the balancing of the multi-port amplifier is performed by balancing an inner layer first, and proceeding recursively towards an outer layer.

16. The method of claim 14 wherein the selected schedule follows a top-down approach, wherein the multi-port amplifier is viewed as a sequence of nested layers of multi-port amplifiers, and the balancing of the multi-port amplifier is performed by balancing portions of an outer layer first, and proceeding recursively towards an inner layer.

17. The method of claim 10 wherein the plurality of test patterns include a sinusoidal test pattern.

18. The method of claim 10 wherein the output signal is a null value.

19. The method of claim 18 wherein the null value is free from any sinusoidal information.

20. The method of claim 10 wherein the designated output is at least two locations when N is an even number greater than 2 but not $2^n$, where n is an integer greater than 1.

21. The method of claim 10 wherein N is equal to $2^n$, where n is an integer greater than 1.

22. The method of claim 10 wherein the amplifiers are configured to input a PSK waveform such as BPSK, QPSK, OQPSK, UQPSK and 8PSK or MSK waveforms such as SMSK and GMSK.

23. The method of claim 10 wherein the amplifiers are configured for communication traffic such as TDMA, FDMA, orthogonal FDMA, CDMA, and WCDMA.

24. The method of claim 10 wherein the adjusting is provided remotely via command and telemetry.

25. The method of claim 10 wherein the adjusting is provided locally and autonomously by a computer or microcomputer.

26. The method of claim 10 wherein the amplifiers, selecting, detecting, and adjusting are provided within a spacecraft.

27. The method of claim 10 further comprising replacing one of the amplifiers with a spare amplifier based upon the output signal at the designated output.

28. The method of claim 10 further comprising performing the selecting, detecting, and adjusting upon initiation of a signal corresponding to a maintenance cycle from a remote location.

29. The method of claim 10 further comprising transferring information associated with the output signal to earth.

30. The method of claim 10 wherein the amplifiers are selected from high power amplifiers such as SSPA (solid state power amplifiers), TWTA (traveling wave tube amplifiers), Klystron and Magnetron or from low noise amplifiers (LNA) and communication receivers.

31. A method for tuning a multi-port amplifier, the method comprising:
  providing a multi-port amplifier having more than two amplifiers;
  selecting one of a plurality of test patterns to be input as a test signal into one or more of the amplifiers to detect a phase information of one of the amplifiers;
  detecting an output signal at a designated output coupled to the amplifiers;
  selecting a spare amplifier for the one of the amplifiers based upon the output signal;
  selecting one of the plurality of test patterns to be input into the spare amplifier;
  detecting an output signal from the spare amplifier at the designated output; and
  adjusting a phase relationship of the spare amplifier based upon the output signal.

32. A method for tuning a multi-port amplifier, the method comprising:
  injecting a test signal to an input port of the multi-port amplifier:
  monitoring the test signal via test couplers at outputs of a first hybrid for a null value to balance a pair of amplifiers connected to the first hybrid
  using an external hybrid coupled to inputs of the first hybrid and a second hybrid to monitor for a null value, and to balance an amplifier connected to the second hybrid and one of the pair of amplifiers.

33. A method for tuning a group of multi-port amplifiers, the method comprising:
  providing a plurality of multi-port amplifiers arranged in a parallel configuration;
  selecting one of a plurality of test patterns to be input into a first one of the plurality of multi-port amplifiers to detect a phase of a first amplifier of the first one of the plurality of multi-port amplifiers;
  balancing the first one of the plurality of multi-port amplifiers;
  equalizing the phase of a first amplifier of a second one of the plurality of multi-port amplifiers with the phase of the first amplifier of the first one of the plurality of multi-port amplifiers using an external hybrid;
  balancing the second one of the plurality of multi-port amplifiers; and
  repeating the above process for remaining ones of the plurality of multi-port amplifiers; whereupon the repeating includes equalizing a phase of a first amplifier of a remaining one of the plurality of multi-port amplifiers with a phase of a first amplifier of an already balanced one of the plurality of multi-port amplifiers, and then balancing the remaining one of the plurality of multi-port amplifiers.

* * * * *

UNITED STATES PATENT AND TRADEMARK OFFICE
CERTIFICATE OF CORRECTION

PATENT NO. : 7,088,173 B1  
APPLICATION NO. : 10/840942  
DATED : August 8, 2006  
INVENTOR(S) : Novellone Rozario et al.

Page 1 of 1

It is certified that error appears in the above-identified patent and that said Letters Patent is hereby corrected as shown below:

IN THE SPECIFICATION:

On Column 5, line 49, "BPAs" should read --HPAs--.

Signed and Sealed this

Third Day of July, 2007

JON W. DUDAS  
*Director of the United States Patent and Trademark Office*